United States Patent
Ishii

(10) Patent No.: US 9,324,741 B2
(45) Date of Patent: Apr. 26, 2016

(54) DISPLAY DEVICE, MANUFACTURING METHOD OF DISPLAY DEVICE AND ELECTRONIC EQUIPMENT

(75) Inventor: Takahide Ishii, Kanagawa (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 13/417,360

(22) Filed: Mar. 12, 2012

(65) Prior Publication Data
US 2012/0241745 A1 Sep. 27, 2012

(30) Foreign Application Priority Data
Mar. 24, 2011 (JP) ................................. 2011-066283

(51) Int. Cl.
*H01L 27/12* (2006.01)
*H01L 33/38* (2010.01)
*H01L 51/52* (2006.01)

(52) U.S. Cl.
CPC ......... *H01L 27/1288* (2013.01); *H01L 27/1225* (2013.01); *H01L 33/38* (2013.01); *H01L 51/5209* (2013.01)

(58) Field of Classification Search
CPC . H01L 27/1288; H01L 27/1225; H01L 33/36; H01L 33/38; H01L 51/5203; H01L 51/5209
USPC ............................................... 438/34, 35, 45
See application file for complete search history.

(56) References Cited

U.S. PATENT DOCUMENTS

| | | | | |
|---|---|---|---|---|
| 6,613,610 B2 * | 9/2003 | Iwafuchi | ............. | H01L 21/2007 257/E21.122 |
| 6,953,951 B2 * | 10/2005 | Yamazaki | ............. | G02F 1/3454 257/347 |
| 7,161,179 B2 * | 1/2007 | Yamazaki | ........... | G02F 1/13454 257/59 |
| 2001/0030322 A1 * | 10/2001 | Yamazaki | ........... | H01L 27/1248 257/59 |
| 2002/0145582 A1 * | 10/2002 | Yamazaki | ............ | G09G 3/3648 345/92 |
| 2005/0142704 A1 * | 6/2005 | Oh | ...................... | G02F 1/13458 438/158 |
| 2006/0160357 A1 * | 7/2006 | Muranaka | ..................... | 438/642 |
| 2007/0018169 A1 * | 1/2007 | Lee et al. | ........................ | 257/72 |

(Continued)

FOREIGN PATENT DOCUMENTS

| JP | 2001-195008 A | | 7/2001 | |
|---|---|---|---|---|
| JP | 2003-179069 A | | 6/2003 | |
| JP | 2013-179069 | * | 6/2003 | ............ H01L 21/336 |

OTHER PUBLICATIONS

Machine translation, Hashimoto, Japanese Pat. Pub. No. 2003-179069, Espacenet, translation date: Dec. 19, 2015; all pages.*

(Continued)

*Primary Examiner* — Victoria K Hall
(74) *Attorney, Agent, or Firm* — Wolf, Greenfield & Sacks, P.C.

(57) ABSTRACT

Disclosed herein is a manufacturing method of a display device including: forming a gate electrode on a substrate; forming a laminated film by photolithography techniques. The laminated film is provided above the gate electrode with a gate insulating film sandwiched therebetween and includes a semiconductor layer, at least either a source/drain electrode or a pixel electrode, a planarizing film and a pixel isolation film. The manufacturing method further includes forming a functional layer and a common electrode in this order after the formation of the laminated film. The functional layer includes an organic electric field light-emitting layer. Two or more layers are patterned all together in at least part of the laminated film during the formation of the laminated film.

12 Claims, 42 Drawing Sheets

(56) References Cited

U.S. PATENT DOCUMENTS

| | | | |
|---|---|---|---|
| 2007/0247556 A1* | 10/2007 | Jang ................. G02F 1/136209 349/38 |
| 2008/0042138 A1* | 2/2008 | Park et al. ........................ 257/72 |
| 2008/0055503 A1* | 3/2008 | Cheng ................... G02F 1/1368 349/38 |
| 2008/0083927 A1* | 4/2008 | Nishiura ........... G02F 1/136227 257/72 |
| 2008/0111484 A1* | 5/2008 | Kwon et al. .................. 313/506 |
| 2008/0246042 A1* | 10/2008 | Ting ................. G02F 1/136213 257/89 |
| 2008/0277666 A1* | 11/2008 | Jeon et al. ....................... 257/66 |
| 2009/0051286 A1* | 2/2009 | Yamazaki et al. ............. 313/512 |
| 2009/0121982 A1* | 5/2009 | Choi .................. H01L 27/3262 345/76 |
| 2010/0051940 A1* | 3/2010 | Yamazaki et al. ............... 257/43 |
| 2010/0096634 A1* | 4/2010 | Park et al. ....................... 257/59 |
| 2010/0097431 A1* | 4/2010 | Takakuwa ....................... 347/68 |
| 2011/0291101 A1* | 12/2011 | Choi .................... H01L 27/1214 257/72 |
| 2011/0297951 A1* | 12/2011 | Shin .................... H01L 27/1288 257/71 |
| 2011/0303921 A1* | 12/2011 | Shin .................... H01L 27/3244 257/71 |
| 2012/0104393 A1* | 5/2012 | Cho .................... H01L 27/1255 257/59 |
| 2015/0348945 A1* | 12/2015 | Or-Bach ............... H01L 21/743 257/384 |

OTHER PUBLICATIONS

Machine translation, Office Action, Japan Patent Office, Japanese Patent Application No. 2011-066283, dated Aug. 31, 2015, Google translate, translation date: Dec. 22, 2015; all pages.*

* cited by examiner

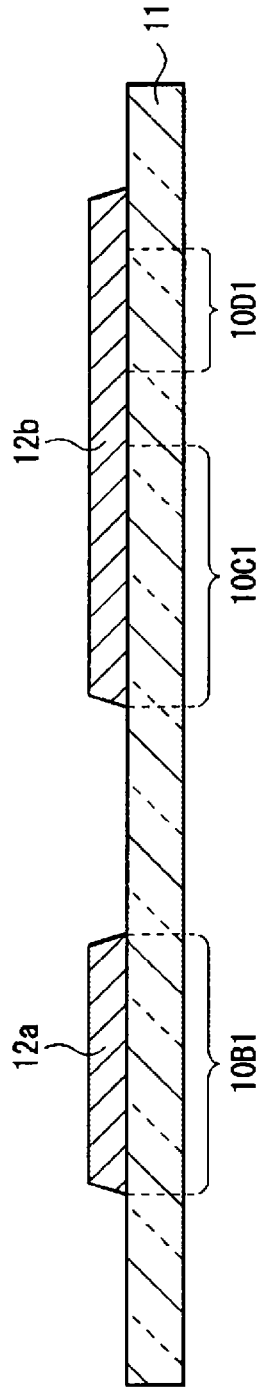
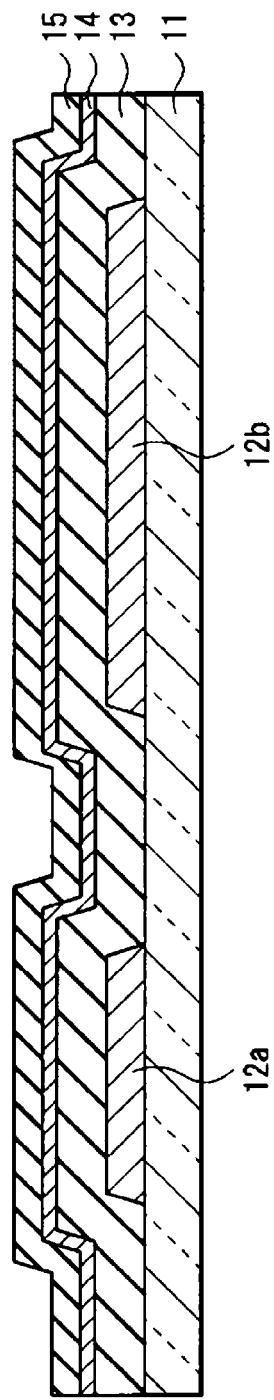

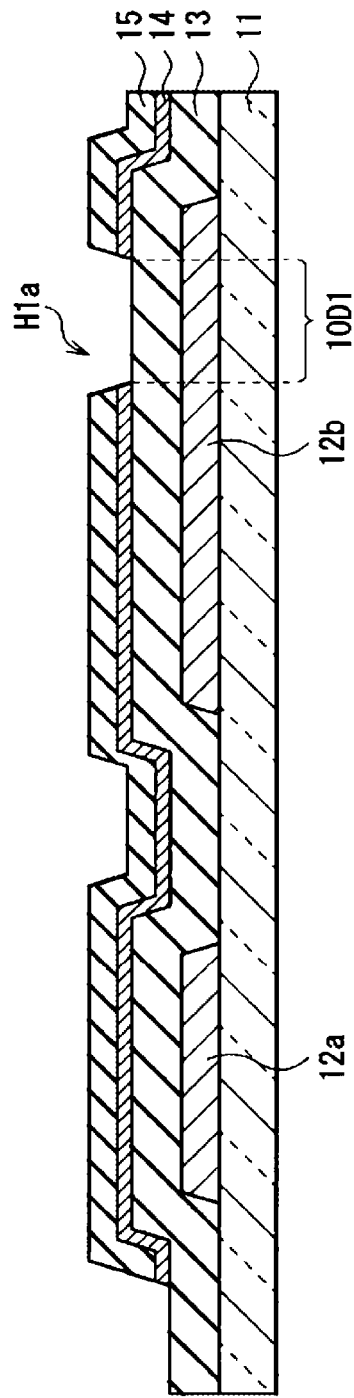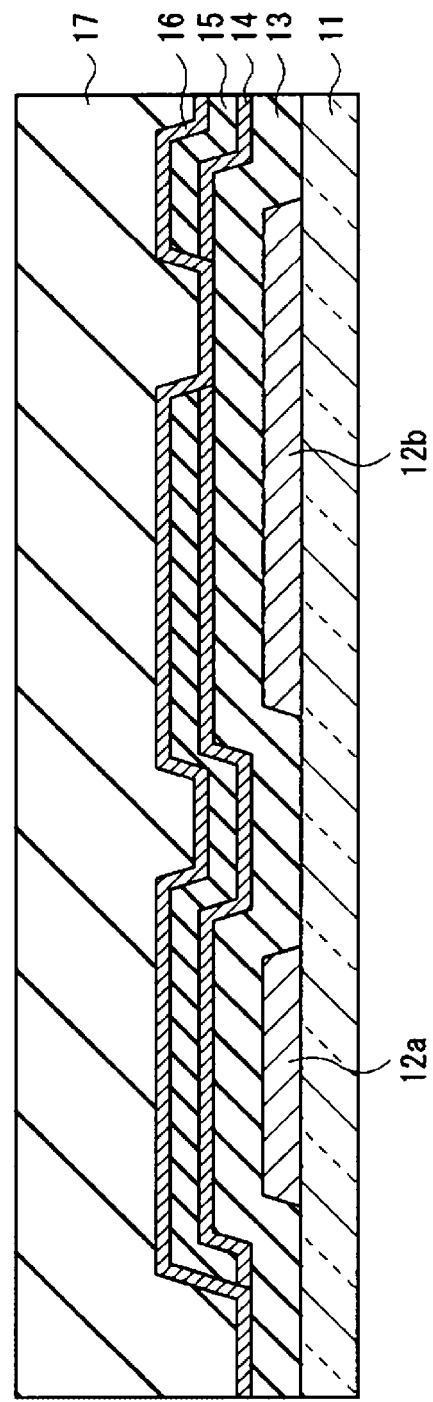

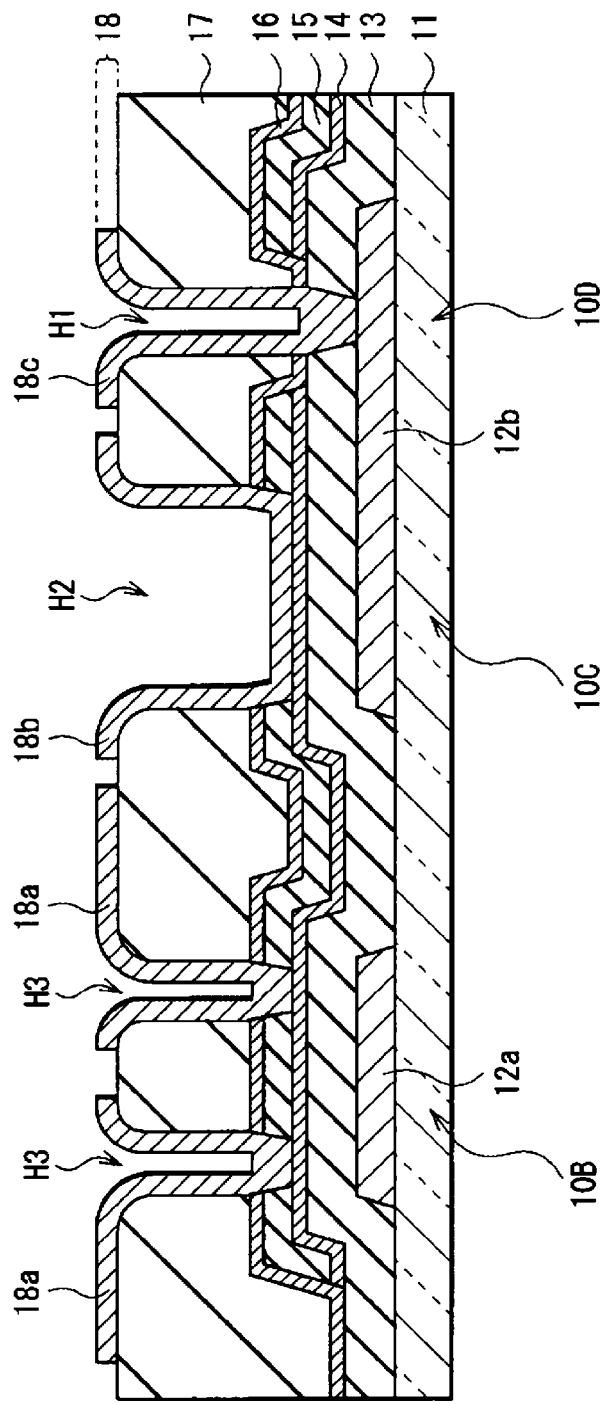

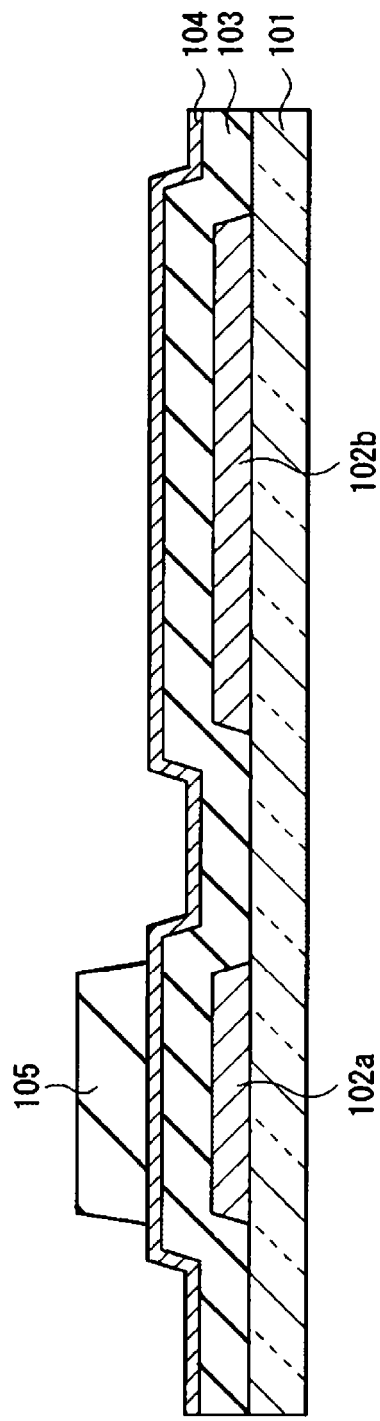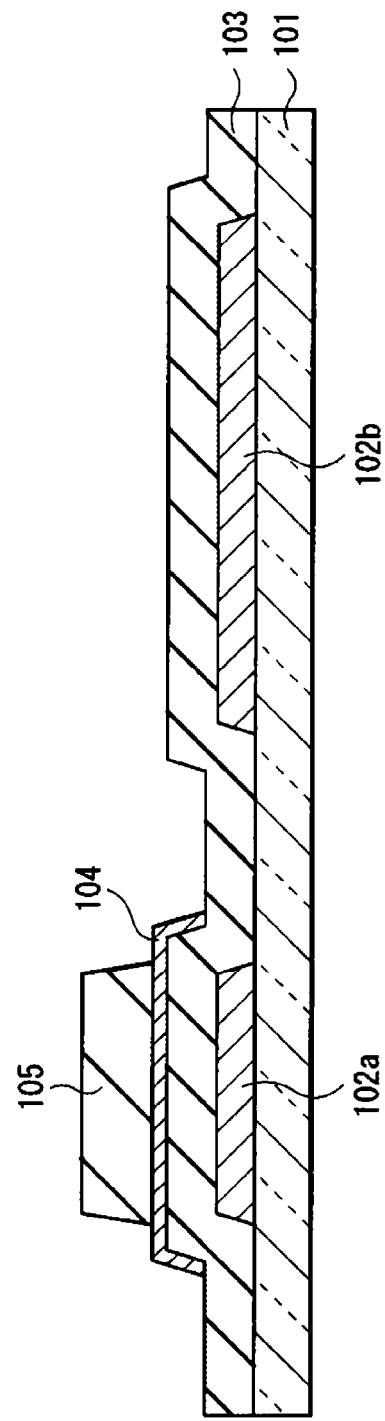

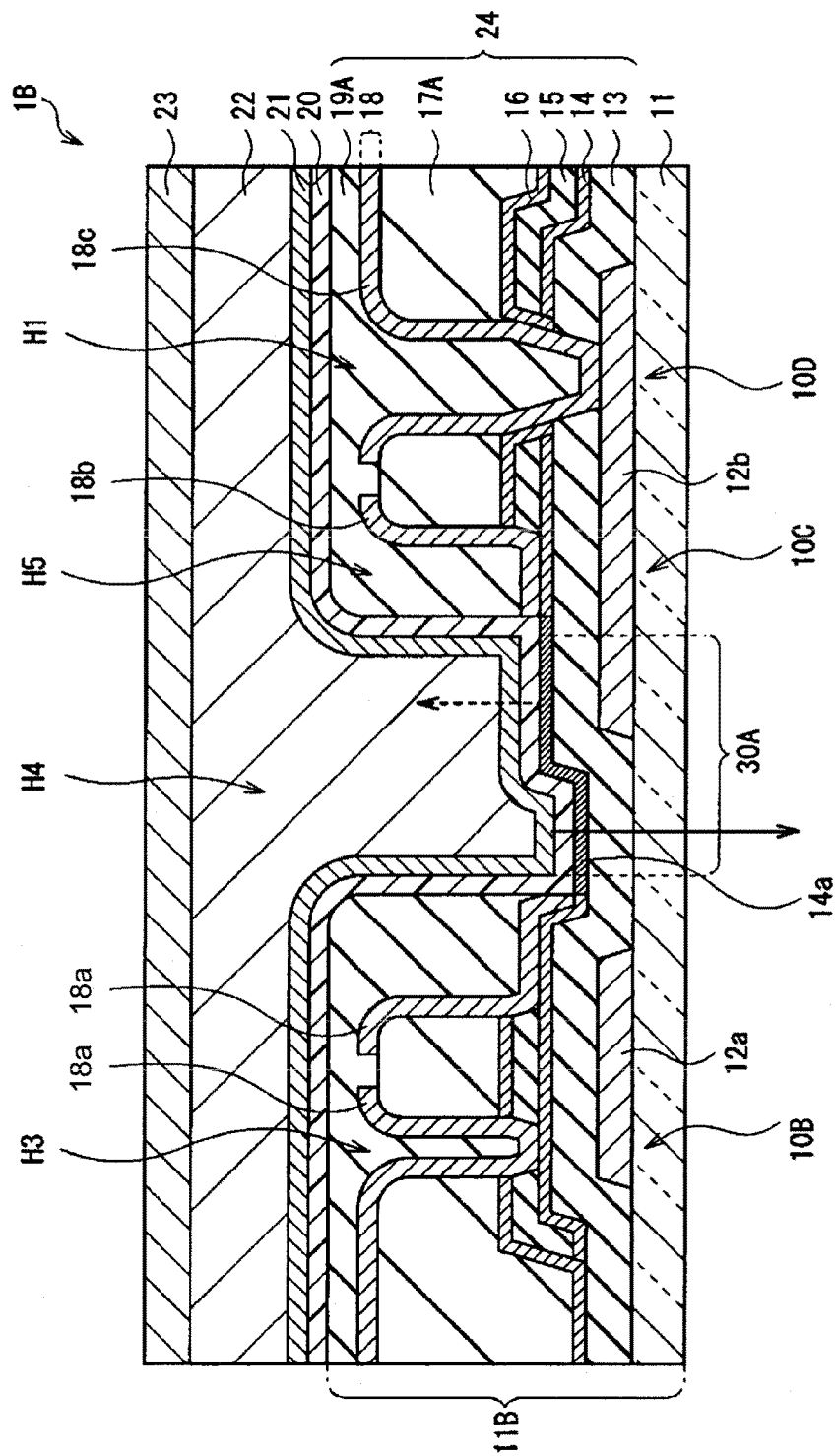

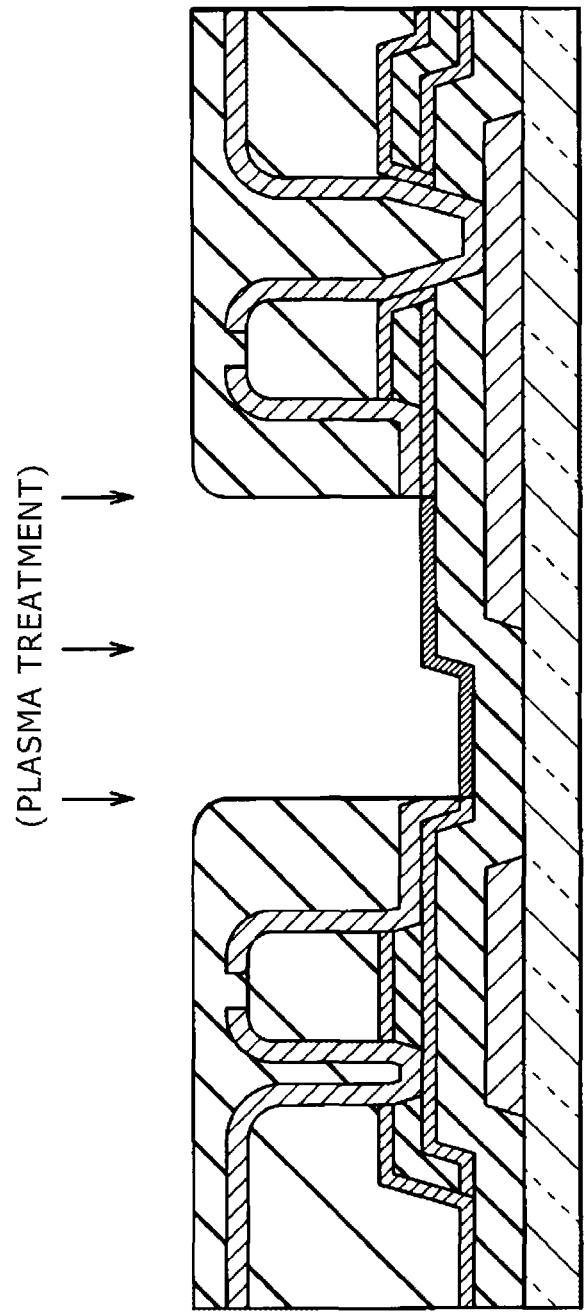

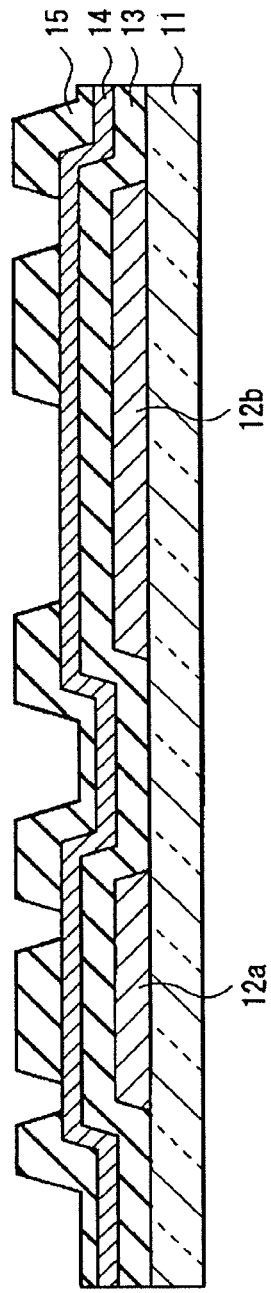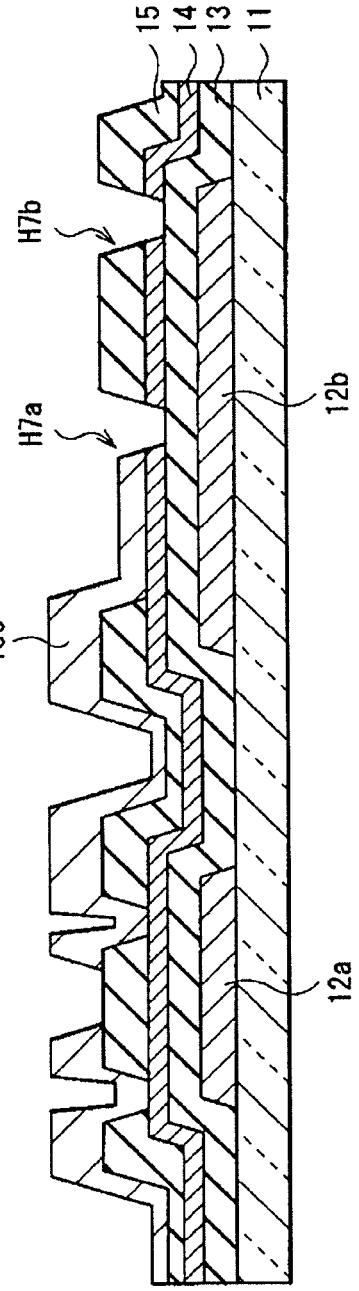

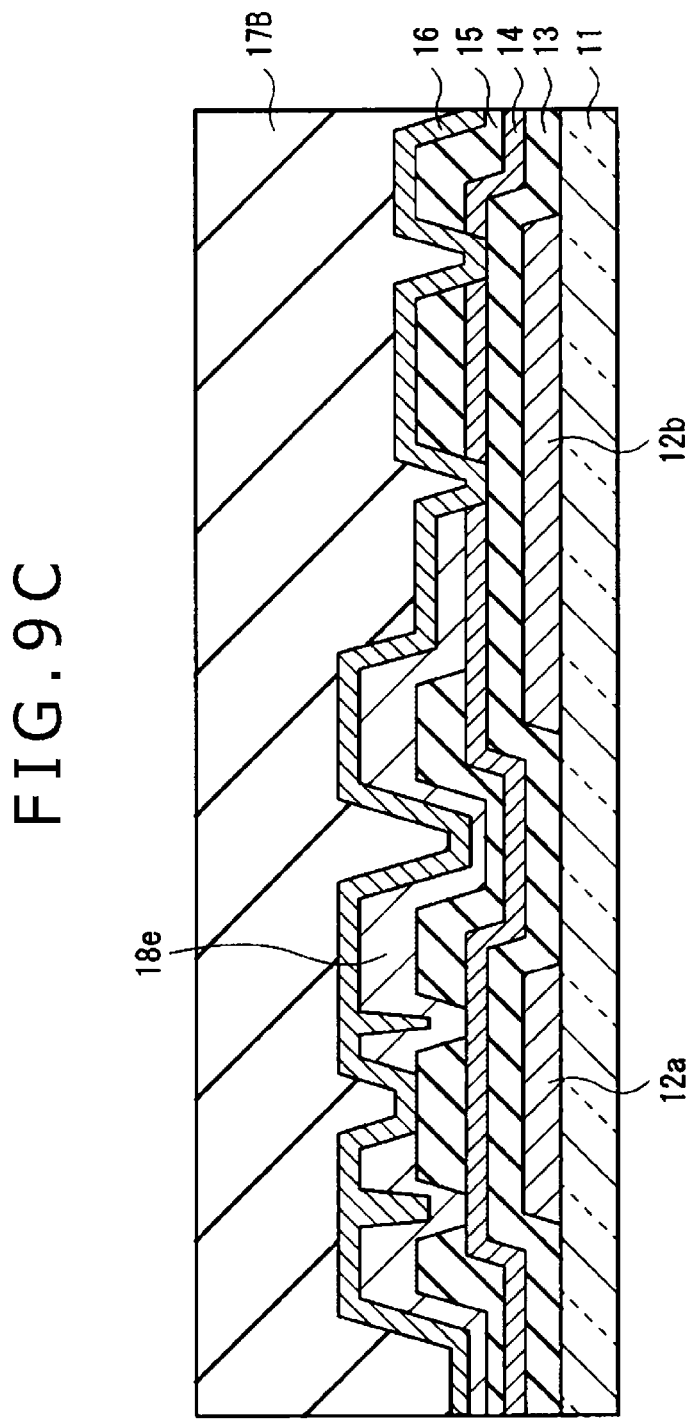

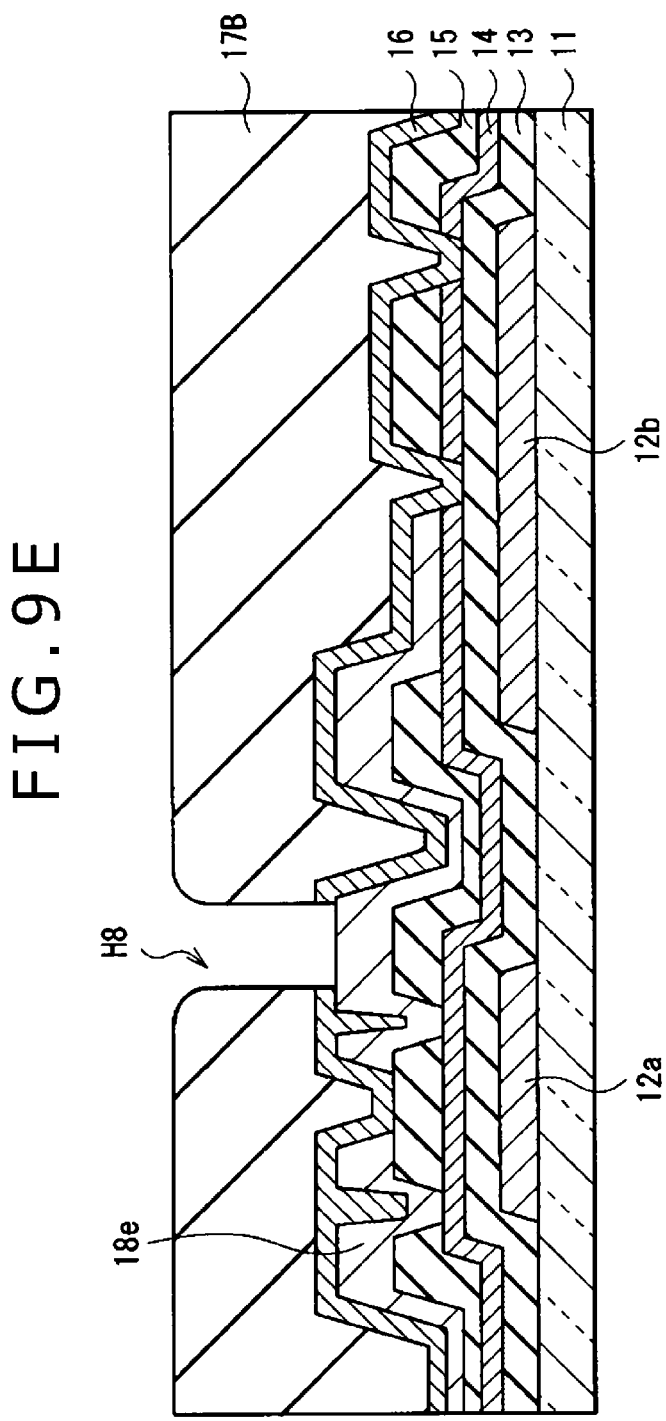

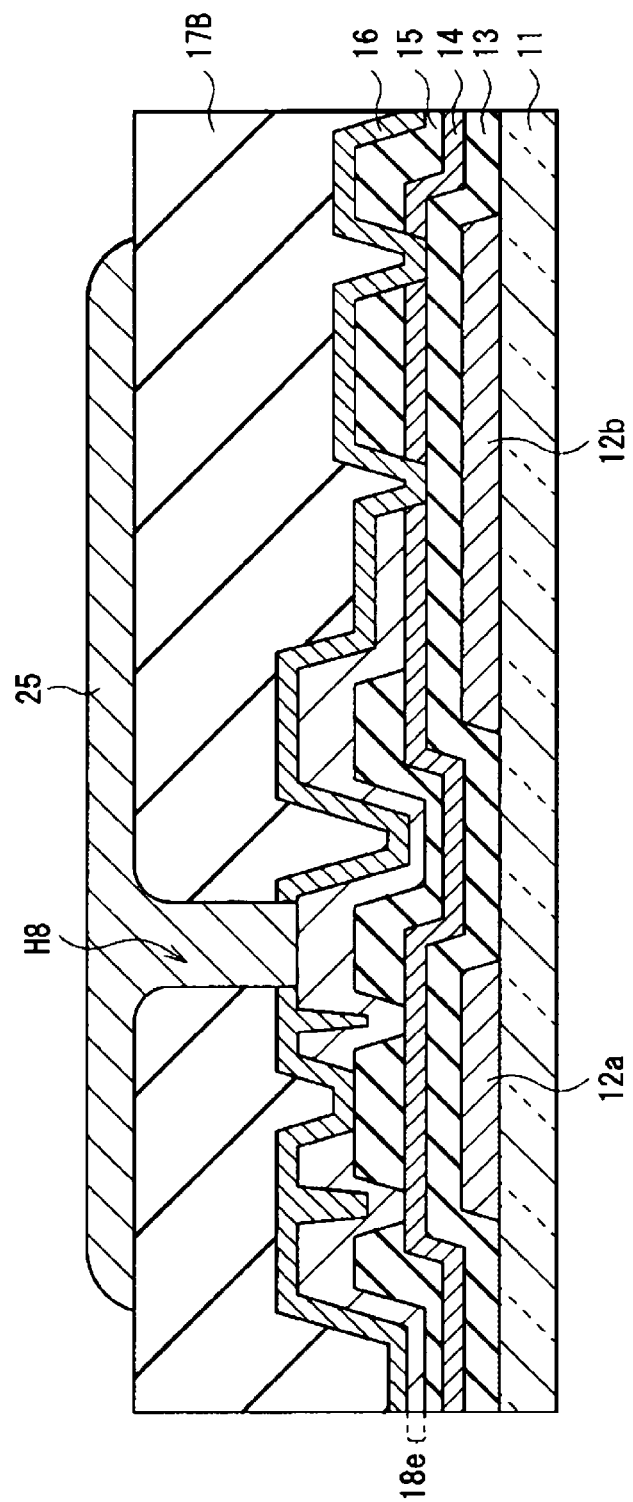

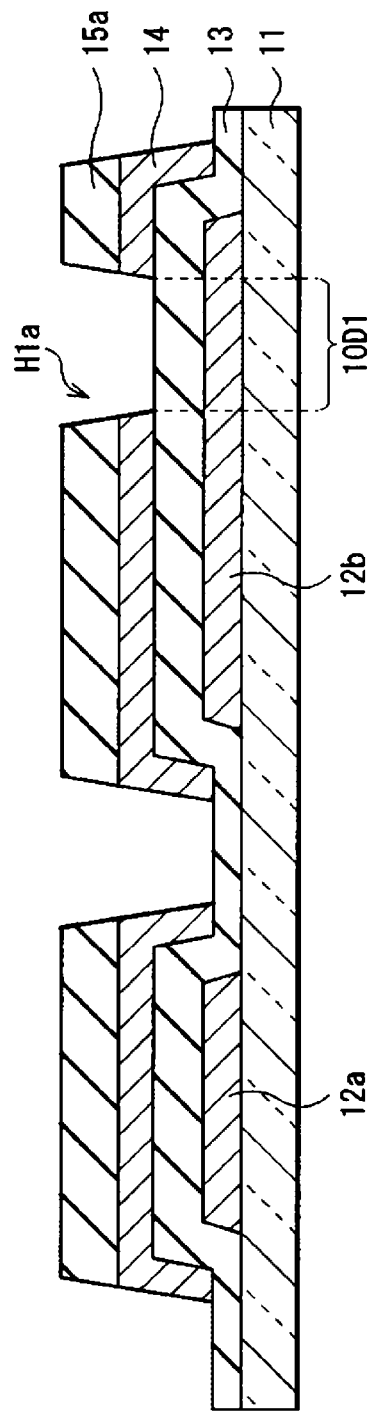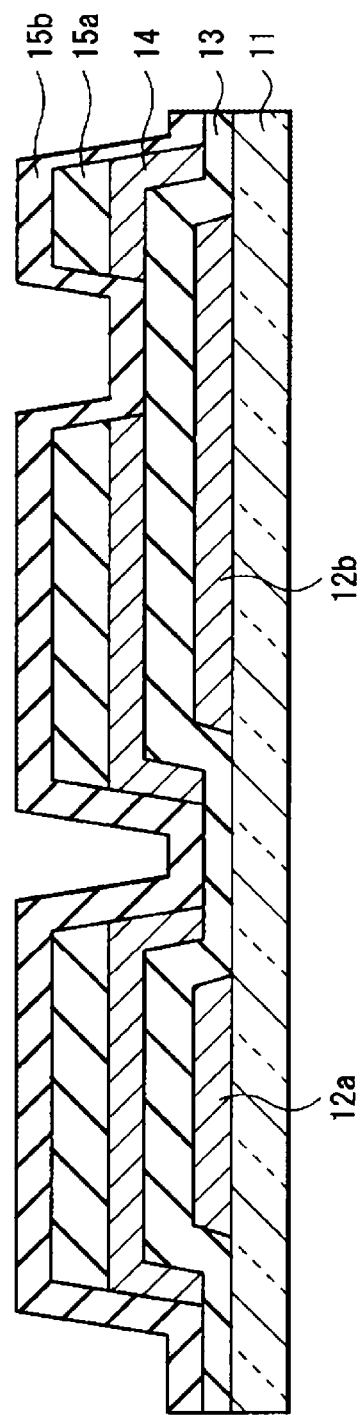

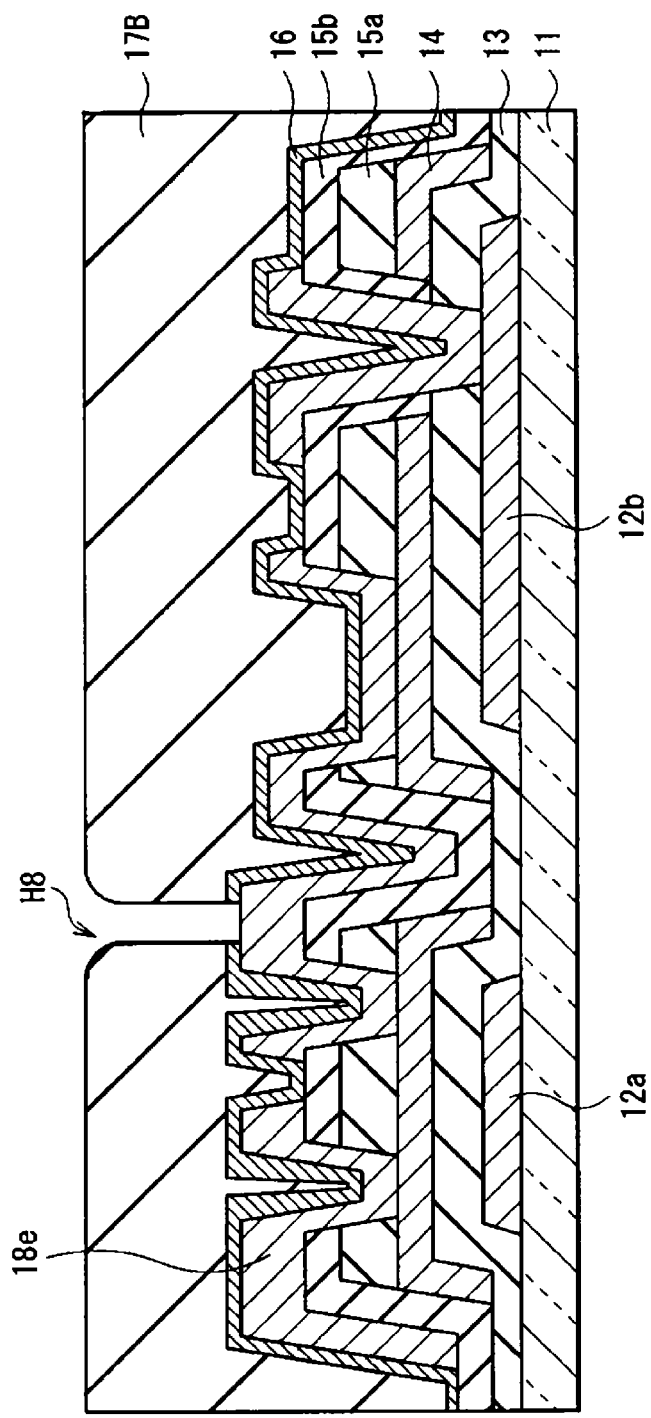

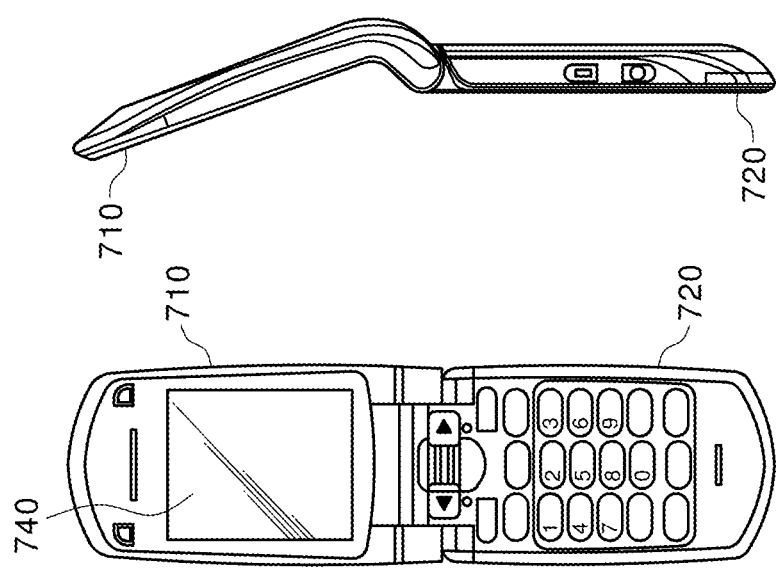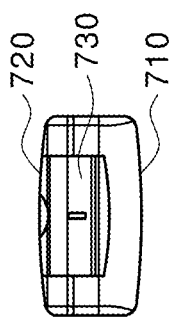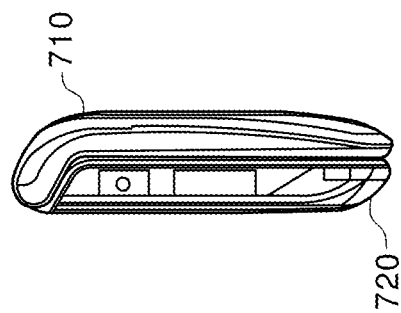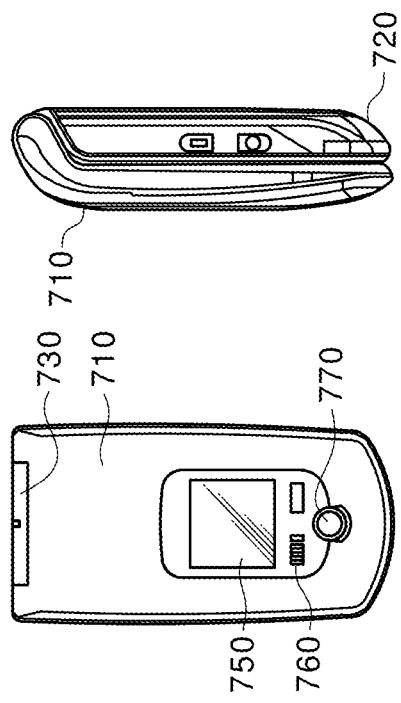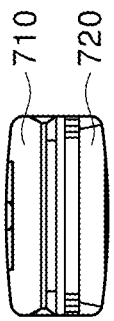

DISPLAY DEVICE, MANUFACTURING METHOD OF DISPLAY DEVICE AND ELECTRONIC EQUIPMENT

CROSS REFERENCE TO RELATED APPLICATION

This application claims the priority benefit of Japanese Patent Application JP 2011-066283 filed in the Japanese Patent Office on Mar. 24, 2011, the entire content of which is hereby incorporated by reference.

BACKGROUND

The present disclosure relates to a manufacturing method of a display device having a photolithography process and a display device manufactured thereby.

In a flat panel display such as an organic EL (Electro Luminescence) display device, thin film transistors (TFTs), an interconnect layer and other components adapted to drive pixels are arranged on a substrate, and pixels including an organic EL layer are formed on top thereof (e.g., Japanese Patent Laid-Open No. 2001-195008). In manufacturing steps of such a display device, each of the layers is patterned by a thin film formation process based on photolithography techniques.

SUMMARY

In a manufacturing process based on photolithography techniques as described above, photomasks are used on which patterns of the respective layers are drawn in advance. However, TFTs and capacitive elements are formed on a substrate first, and then coated with a planarizing film, after which the patterns of a pixel electrode and pixel isolation film are formed on the planarizing film. Therefore, a different photomask is necessary for patterning of each layer. Further, photoresist and other materials are necessary at each patterning step, and the formed layers undergo coating, exposure, development, post-bake and other steps, thus resulting in more film formation steps and higher cost.

The present disclosure has been made in light of the foregoing, and it is desirable to provide a display device that can be manufactured by a low-cost and simple process, a manufacturing method of the same and electronic equipment having the same.

A manufacturing method of a display device according to an embodiment of the present disclosure includes forming a gate electrode on a substrate and forming a laminated film by photolithography techniques. The laminated film is provided above the gate electrode with a gate insulating film sandwiched therebetween and includes a semiconductor layer, at least either a source/drain electrode or a pixel electrode, a planarizing film and a pixel isolation film. The manufacturing method further includes forming a functional layer and a common electrode in this order after the formation of the laminated film. The functional layer includes an organic electric field light-emitting layer. In the formation of the laminated film, two or more layers are patterned all together in at least part of the laminated film.

In the manufacturing method of a display device according to another embodiment of the present disclosure, a laminated film is formed by photolithography techniques in the laminated film formation step after forming a gate electrode on a substrate. The laminated film is provided above the gate electrode with a gate insulating film sandwiched therebetween and included a semiconductor layer, at least either a source/ drain electrode or a pixel electrode, a planarizing film and a pixel isolation film. Then, a functional layer and a common electrode are formed in this order, thus forming a display device. The functional layer includes an organic electric field light-emitting layer. In the laminated film formation step, two or more layers are patterned all together in at least part of the laminated film, thus contributing to less consumption of photomasks as compared to patterning of one layer at a time. Further, the manufacturing method contributes to less consumption of photoresist and other materials and a smaller number of steps.

A display device according to a further embodiment of the present disclosure includes: a gate electrode provided on a substrate; a laminated film provided above the gate electrode with a gate insulating film sandwiched therebetween, including a semiconductor layer, at least either a source/drain electrode or a pixel electrode, a planarizing film and a pixel isolation film; a functional layer provided on the pixel isolation film of the laminated film and including an organic electric field light-emitting layer; and a common electrode provided on the functional layer. An opening is provided in at least part of the laminated film to penetrate two or more layers.

Electronic equipment according to a further embodiment of the present disclosure includes the display device according to the embodiment of the present disclosure.

The manufacturing method of the display device according to a further embodiment of the present disclosure forms the laminated film by photolithography techniques after forming the gate electrode on the substrate. The laminated film is provided above the gate electrode with the gate insulating film sandwiched therebetween and includes the semiconductor layer, at least either the source/drain electrode or the pixel electrode, the planarizing film and the pixel isolation film. Then, the manufacturing method forms the functional layer and the common electrode in this order, thus forming the display device. The functional layer includes the organic electric field light-emitting layer. Two or more layers are patterned all together in at least part of the laminated film, contributing to less consumption of photomasks, photoresist and other materials and a smaller number of steps. This allows for manufacture of a display device by a low-cost and simple process.

The display device according to a further embodiment of the present disclosure includes not only the gate electrode provided on the substrate and also includes the laminated film. The laminated film is provided above the gate electrode with the gate insulating film sandwiched therebetween and includes the semiconductor layer, at least either the source/ drain electrode or the pixel electrode, the planarizing film and the pixel isolation film. The opening is provided in at least part of the laminated film to penetrate two or more layers. This contributes to less consumption of photomasks, photoresist and other materials and a smaller number of steps, thus allowing for manufacture of a display device by a low-cost and simple process.

BRIEF DESCRIPTION OF THE DRAWINGS

FIGS. 2A and 2B are diagrams illustrating the manufacturing method of a TFT shown in FIG. 1 in order of the steps;

FIGS. 2C and 2D are diagrams illustrating steps continued from FIGS. 2A and 2B;

FIG. 2G is a diagram illustrating a step continued from FIG. 2F;

FIGS. 3A and 3B are diagrams illustrating the manufacturing method of a TFT according to a comparative example in order of the steps;

FIG. 5 illustrates the cross-sectional structure of a display device according to a second embodiment of the present disclosure;

FIG. 6F is a diagram illustrating a step continued from FIG. 6E;

FIGS. 9A and 9B are diagrams illustrating the manufacturing method of the display device shown in FIG. 8 in order of the steps;

FIG. 9C is a diagram illustrating a step continued from FIGS. 9A and 9B;

FIG. 9E is a diagram illustrating a step continued from FIG. 9D;

FIG. 9F is a diagram illustrating a step continued from FIG. 9E;

FIGS. 11A and 11B are diagrams illustrating the manufacturing method of the display device shown in FIG. 10 in order of the steps;

FIG. 11G is a diagram illustrating a step continued from FIG. 11F;

FIG. 19A is a front view of application example 5 in an open position, FIG. 19B is a side view thereof, FIG. 19C is a front view in a closed position, FIG. 19D is a left side view, FIG. 19E is a right side view, FIG. 19F is a top view, and FIG. 19G is a bottom view.

DETAILED DESCRIPTION OF THE PREFERRED EMBODIMENTS

A detailed description will be given below of the preferred embodiments of the present disclosure with reference to the accompanying drawings. It should be noted that the description will be given in the following order.

1. First embodiment (example in which a total of five photomasks are used in a drive substrate formation step (TFT source/drain is used as a pixel electrode))
2. Second embodiment (example in which four photomasks are used in the drive substrate formation step (TFT semiconductor layer is used as the pixel electrode))
3. Third embodiment (example in which six photomasks are used in the drive substrate formation step)
4. Fourth embodiment (example in which seven photomasks are used in the drive substrate formation step)
5. Application examples (examples of a module and electronic equipment)

First Embodiment

[Configuration of the Display Device 1A]

Figure 1:
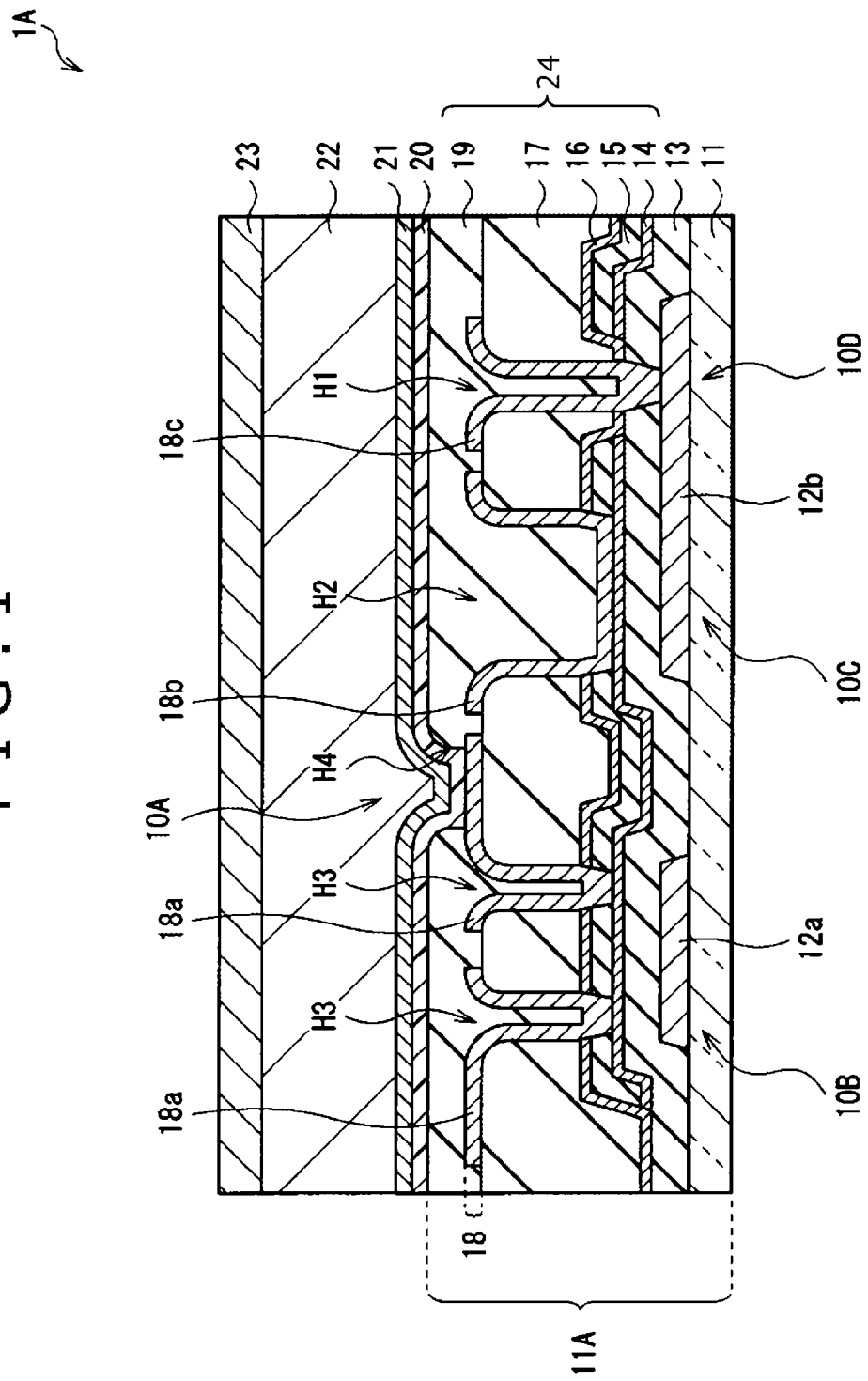
FIG. 1 illustrates the cross-sectional structure of a display device according to a first embodiment of the present disclosure.

FIG. 1 illustrates the cross-sectional structure of a display device 1A according to a first embodiment of the present disclosure. The display device 1A is, for example, an active matrix type organic EL display and has a plurality of pixels arranged in a matrix form. It should be noted, however, that FIG. 1 shows only the region for one pixel. The display device 1A includes a functional layer 20, a common electrode 21 and a protective layer 22 on a drive substrate 11A. The functional layer 20 includes an organic EL layer. A sealing substrate 23 is attached to the protective layer 22 using an unshown adhesive layer. In the functional layer 20, a region for an opening H4 of a pixel isolation film 19 which will be described later serves as a light-emitting section 10A. The display device 1A may be a so-called top emission or bottom emission display device.

In the drive substrate 11A, a transistor section 10B, a capacitor section 10C and an interconnect contact section 10D are provided for each pixel on a substrate 11 to drive the pixel. The specific configuration of each of the transistor section 10B, the capacitor section 10C and the interconnect contact section 10D will be described later.

The functional layer 20 includes an organic EL layer, emitting light when applied with a drive current. The functional layer 20 is made up, for example, of a hole injection layer, a hole transport layer, an organic EL layer and an electron transport layer (none of them are shown) that are stacked in this order from the side of the substrate 11. The organic EL layer emits light as a result of the recombination of electrons and holes when applied with an electric field. It is only necessary for the organic EL layer to be made of an ordinary low or high molecular weight organic material. The material of the organic EL layer is not specifically limited. Further, the red, green and blue light-emitting layers, for example, may be patterned, one for each pixel. Alternatively, a white light-emitting layer may be provided above the entire surface of the substrate. The hole injection layer is designed to provide enhanced hole injection efficiency and prevent leaks. The hole transport layer is designed to provide enhanced hole transport efficiency to the organic EL layer. The layers other than the organic EL layer are provided as necessary.

The common electrode 21 acts, for example, as a cathode and includes a metal conductive film. If the display device 1A is a bottom emission display device, the common electrode 21 includes a reflective metal film, and more specifically, a single metal made of one of aluminum (Al), magnesium (Mg), calcium (Ca) and sodium (Na), a single-layer film made of an alloy containing at least one of the above, or a multilayer film made up of two or more layers of the above metals stacked one on top of another. Alternatively, if the display device 1A is a top emission display device, the common electrode 21 includes a transparent conductive film made, for example, of ITO (indium tin oxide). The common electrode 21 is formed on the functional layer 20 while being insulated from the anode (a source/drain electrode layer 18 which will be described later in the present embodiment) so that the common electrode 21 can be shared among all the pixels.

The protective layer 22 may be made of an insulating or conductive material. Among insulating materials that can be used are amorphous silicon (a-Si), amorphous silicon carbide (a-SiC), amorphous silicon nitride (a-$Si_{1-x}N_x$) and amorphous carbon (a-C).

The sealing substrate 23 includes a plate material made, for example, of quartz, glass, metal foil, silicon or plastic. It should be noted, however, that if the display device 1A is a top emission display device, the sealing substrate 23 includes a transparent substrate made, for example, of glass or plastic and may have, for example, an unshown color filter or light-shielding film.

[Detailed Configuration of the Drive Substrate 11A]

The drive substrate 11A includes the transistor section 10B, the capacitor section 10C and the interconnect contact section 10D as described above. In the present embodiment, the patterns of the transistor section 10B, the capacitor section 10C and the interconnect contact section 10D are formed on the substrate 11 by a thin film formation process based on photolithography techniques although described in detail later.

The substrate 11 includes a plate material made, for example, of quartz, glass, metal foil, silicon or plastic. It should be noted, however, that if the display device 1A is a bottom emission display device, the substrate 11 includes a transparent substrate made, for example, of glass or plastic.

(Transistor Section 10B)

The transistor section 10B corresponds to a sampling transistor 5A or a drive transistor 5B in a pixel drive circuit 50a which will be described later and is a TFT having an inverted staggered (so-called bottom gate) structure. The transistor section 10B has a gate electrode 12a arranged on the substrate 11, and a semiconductor layer 14 is provided on the gate electrode 12a with a gate insulating film 13 sandwiched therebetween. A first protective film 15, a second protective film 16 and a planarizing film 17 are stacked in this order on the semiconductor layer 14. In the first protective film 15, the second protective film 16 and the planarizing film 17, contact holes H3 (openings) are provided to penetrate these films from the surface of the planarizing film 17 to that of the semiconductor layer 14. The source/drain electrode layer 18 (source/drain electrodes 18a) is formed on the planarizing film 17 in such a manner as to fill the contact holes H3. A laminated film 24 made up of the semiconductor layer 14, the first protective film 15, the second protective film 16, the planarizing film 17, the source/drain electrode layer 18 and the pixel isolation film 19 is a specific example of the "laminated film" in the present disclosure.

The gate electrode 12a serves as an interconnect adapted to control the carrier density of the semiconductor layer 14 based on a gate voltage (Vg) applied to the transistor section 10B and supply a potential. The gate electrode 12a includes a single metal made, for example, of one of molybdenum (Mo), titanium (Ti), aluminum (Al), silver (Ag) and copper (Cu), an alloy thereof, or a laminated film made of two or more of the above metals. More specifically, the gate electrode 12a has, for example, a laminated structure containing a metal layer made of a low-resistance material such as aluminum or silver sandwiched between molybdenum or titanium films. Alternatively, the gate electrode 12a may be made, for example, of an aluminum-neodymium (Nd) alloy (AlNd alloy). Still alternatively, the gate electrode 12a may include a transparent conductive film made, for example, of ITO, AZO (aluminum-doped zinc oxide) or GZO (gallium-doped zinc oxide).

The gate insulating film 13 is a single-layer film made of one of silicon oxide film ($SiO_2$), silicon nitride film (SiN) and silicon oxynitride film (SiON) or is a laminated film made up of two or more layers of the above materials.

The semiconductor layer 14 forms a channel when applied with a gate voltage and includes, for example, an oxide semiconductor containing at least one of indium (In), gallium (Ga) and zinc (Zn). Indium gallium zinc oxide (IGZO or InGaZnO) is among such oxide semiconductors. This oxide semiconductor film 14 is, for example, 20 to 100 nm in thickness.

The first protective film 15 is a single-layer film made up, for example, of one of silicon oxide film, silicon nitride film and silicon oxynitride film or a laminated film made up of two or more layers of the above materials. The first protective film 15 prevents damage to the semiconductor layer 14. Provision of the first protective film 15 makes it possible to stably maintain the features of the semiconductor layer 14 for extended periods.

The second protective film 16 is made, for example, of aluminum oxide ($Al_2O_3$) and suppresses entry of outside air (e.g., hydrogen) into the semiconductor layer 14. The second protective film 16 also stores oxygen atoms and supplies them to the semiconductor layer 14 in the manufacturing process.

The planarizing film 17 is made, for example, of polyimide or acrylic-based resin and formed above the entire surface of the substrate 11. It should be noted, however, that the contact holes H3 adapted to ensure electrical connection between the source/drain electrode layer 18 and the semiconductor layer 14 are provided in the planarizing film 17, the first protective film 15 and the second protective film 16.

The source/drain electrode layer 18 is made of the same metal or transparent conductive film listed for the gate electrode 12a. The source/drain electrode layer 18 is divided into segments, one for each of the transistor section 10B, the capacitor section 10C and the interconnect contact section 10D. In the present embodiment, the source/drain electrode 18a arranged in the region for the transistor section 10B serves as a source or a drain while also serving as a display pixel electrode (e.g., anode electrode). That is, the source/drain electrode 18a extends to the region for the light-emitting section 10A on the planarizing film 17 and is in contact with the functional layer 20 in the opening H4 of the pixel isolation film 19. In the present embodiment, it is preferred that a metal film made of AlNd alloy should be provided on the topmost surface of the source/drain electrode 18a to prevent thermal deformation.

(Capacitor Section 10C)

The capacitor section 10C serves, for example, as a holding capacitive element 5C in the pixel drive circuit 50a which will be described later. In the capacitor section 10C, an electrode layer 12b is provided on the substrate 11, and the semiconductor layer 14 is provided on the electrode layer 12b with the gate insulating film 13 sandwiched therebetween. The electrode layer 12b is an electrode whose pattern is formed in the same layer and, for example, in the same step as the gate electrode 12a in the transistor section 10B. The gate insulating film 13 and the semiconductor layer 14 are formed continuously from the transistor section 10B.

A contact hole H2 is provided above the semiconductor layer 14 so as to penetrate the first protective film 15, the second protective film 16 and the planarizing film 17. A portion (an electrode layer 18b) for the capacitor section 10C in the source/drain electrode layer 18 is formed in such a manner as to fill the contact hole H2 (at least to cover the bottom surface of the contact hole H2). This allows for a capacitive element to be formed that includes the electrode layer 18b and the gate insulating film 13 which is sandwiched between the semiconductor layer 14 and the electrode layer 12b.

It should be noted that the capacitor section 10C is provided for each pixel. The percentage of the capacitor formation region in each pixel (percentage in the pixel aperture (practical light-emitting region)) should preferably be about 40% or less.

(Interconnect Contact Section 10D)

In the interconnect contact section 10D, the electrode layer 12b is provided to extend from the region for the capacitor section 10C. In the interconnect contact section 10D, a contact hole H1 is provided above the electrode layer 12b so as to penetrate the gate insulating film 13, the second protective film 16 and the planarizing film 17. A portion (electrode layer 18c) for the interconnect contact section 10D in the source/drain electrode layer 18 is formed above the electrode layer 12b in such a manner as to fill the contact hole H1.

As described above, the source/drain electrode layer 18 is provided on the planarizing film 17 in the present embodiment. The pixel isolation film 19 having the opening H4 is formed on the source/drain electrode layer 18. The opening H4 is opposed to the source/drain electrodes 18a. The pixel isolation film 19 is made of a photosensitive resin material such as polyimide or acrylic-based resin.

[Manufacturing Method]

The display device 1A as described above can be manufactured, for example, as described below. First, the pattern of the drive substrate 11A (the gate electrode 12a and the laminated film 24A) is formed using photolithography techniques. For example, each film is formed first, followed by steps including coating with photoresist, pre-bake, exposure using a photomask, development, post-bake, etching (wet or dry), photoresist removal and the like, after which the film is patterned.

In the present embodiment, a total of five photomasks are used in such a photolithography process. Going into more detail, a photomask (M1) (not shown) is used to pattern the gate electrode 12a (the electrode layer 12b), and a total of four photomasks (M2 to M5) (not shown) are used to pattern the laminated film 24 (the semiconductor layer 14, the first protective film 15, the second protective film 16, the planarizing film 17, the source/drain electrode layer 18 and the pixel isolation film 19). More specifically, the drive substrate 11A is manufactured by the following procedure.

That is, the above-described gate electrode material is formed over the entire substrate 11 by, for example, sputtering, followed by patterning by photolithography using the photomask M1 (unshown). More specifically, as illustrated in FIG. 2A, the gate electrode 12a is formed in a selective region (a region 10B1 for the transistor section 10B) on the substrate 11, and the electrode layer 12b is formed across regions 10C1 and 10D1 respectively for the capacitor section 10C and the interconnect contact section 10D. The gate electrode 12a and the electrode layer 12b are formed all together.

Next, as illustrated in FIG. 2B, the gate insulating film 13 is formed, for example, by CVD (Chemical Vapor Deposition) method over the entire surface of the substrate 11 on which the gate electrode 12a and the electrode layer 12b have been formed. At this time, if a silicon nitride film is formed as the gate insulating film 13, a mixture gas containing silane ($SiH_4$), ammonia ($NH_3$) and nitrogen is used as a raw material gas. Alternatively, if a silicon oxide film is formed as the gate insulating film 13, a mixture gas containing silane and dinitrogen oxide ($N_2O$) is used.

Next, the semiconductor layer 14 is formed on the gate insulating film 13, for example, by sputtering. More specifically, IGZO is used as the semiconductor layer 14, reactive sputtering is performed using an IGZO ceramic as a target. At this time, for example, a chamber of a DC (direct current) sputtering system is exhausted to a predetermined vacuum level first. Then, the target and the substrate 11 are placed in the chamber, after which a mixture gas of argon (Ar) and oxygen ($O_2$) is introduced for plasma discharge.

Next, the first protective film 15 made of the above-described materials is formed on the semiconductor layer 14, for example, by CVD method.

Next, as illustrated in FIG. 2C, the first protective film 15 and the semiconductor layer 14 are patterned all together by photolithography using the photomask M2 (unshown). At this time, the surface of the gate insulating film 13 is exposed in the region 10D1 for the interconnect contact section 10D. That is, a contact hole H1a is formed to penetrate the first protective film 15 and the semiconductor layer 14 in the region 10D1.

Next, as illustrated in FIG. 2D, the second protective film 16 made of the materials described above is formed, for example, by sputtering above the entire surface of the substrate 11 followed by the coating with the planarizing film 17, for example, by spin coating or slit coating above the entire surface of the substrate 11.

Figure 2E:
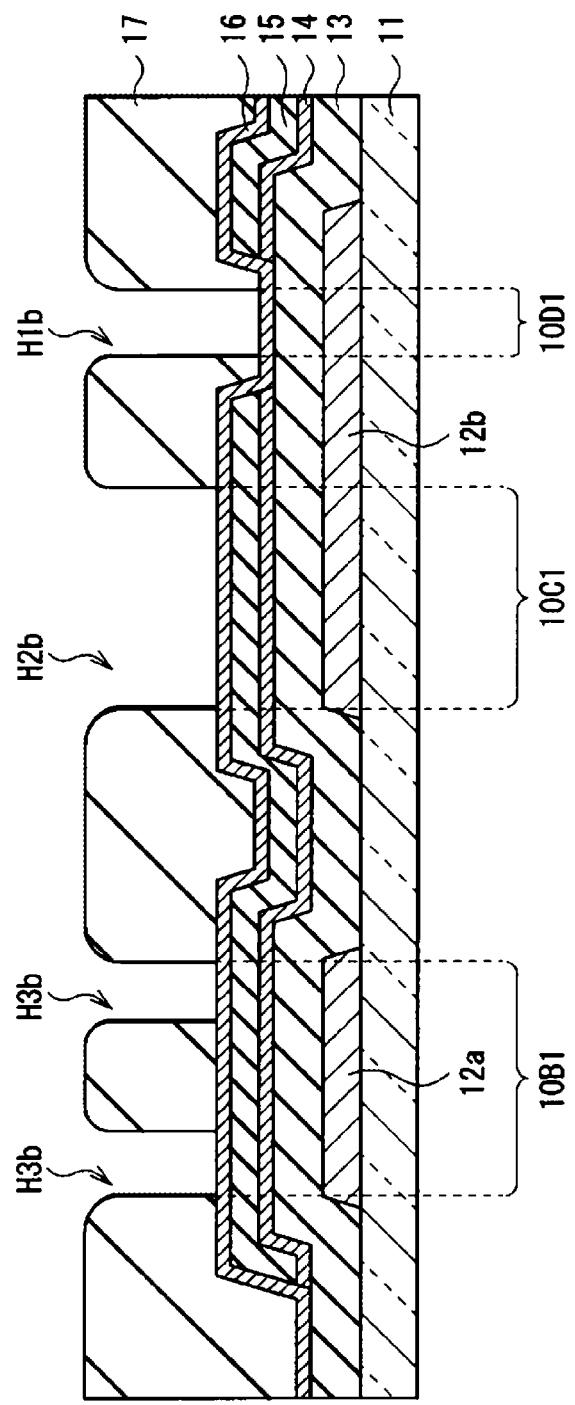
FIG. 2E is a diagram illustrating a step continued from FIGS. 2C and 2D.

Next, as illustrated in FIG. 2E, the planarizing film 17 is patterned by photolithography using the unshown photomask M3. At this time, contact holes H3b are formed in the region 10B1 for the transistor section 10B, and a contact hole H2b is formed in the region 10C1 for the capacitor section 10C, thus exposing the surface of the second protective film 16. A contact hole H1b is also formed in the region 10D1 of the planarizing film 17 for the interconnect contact section 10D, thus exposing the surface of the second protective film 16. That is, the contact holes H1b, H2b and H3b adapted to act as mask openings in the next step are formed in the regions 10B1, 10C1 and 10D1.

Figure 2F:
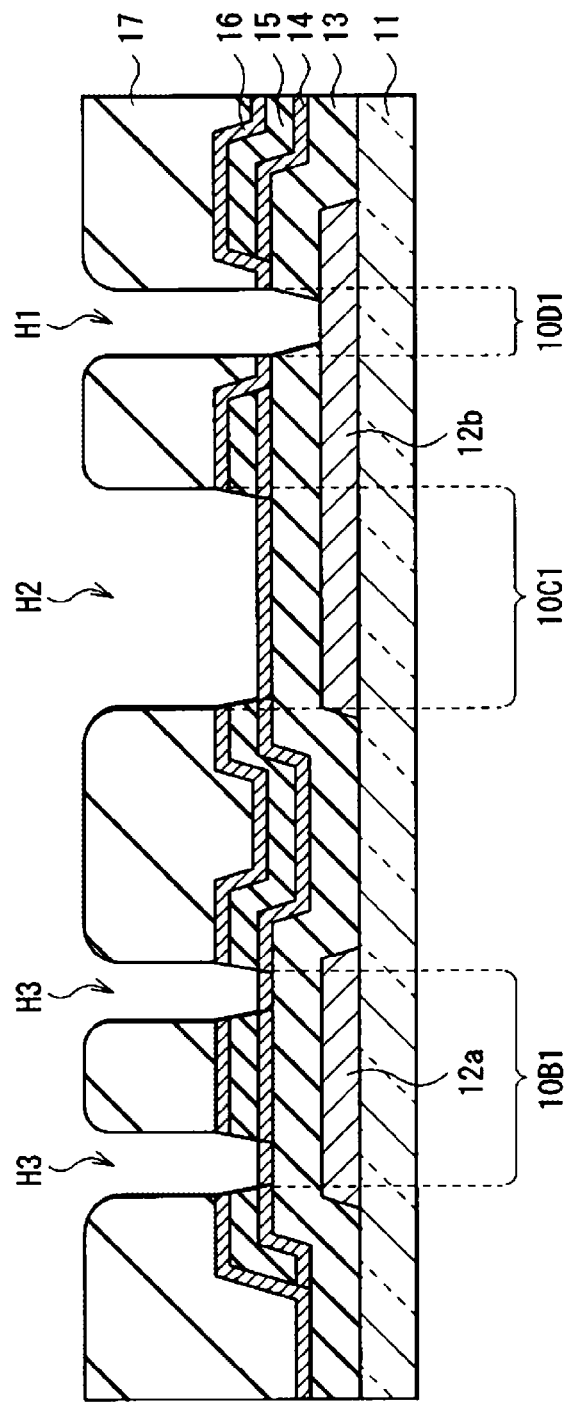
FIG. 2F is a diagram illustrating a step continued from FIG. 2E.

Next, as illustrated in FIG. 2F, dry etching is, for example, performed using the patterned planarizing film 17 as a mask, thus removing selective regions from the second protective film 16 and the first protective film 15 all together in the regions 10B1 and 10C1 and thereby exposing the surface of the semiconductor layer 14. This allows for the contact holes H2 and H3 to be formed that penetrate the planarizing film 17, the second protective film 16 and the first protective film 15.

In the region 10D1, a selective region is removed from the second protective film 16 and the gate insulating film 13, thus exposing the surface of the electrode layer 12b. This allows for the contact hole H1 to be formed that penetrates the planarizing film 17, the second protective film 16 and the gate insulating film 13. It should be noted that the etching selectivity at this time should preferably be, for example, 20 or more between the semiconductor layer 14 and the first protective film 15, and 3 or more between the electrode layer 12b and the gate insulating film 13.

Next, after the formation of the contact holes H1 to H3, the source/drain electrode layer 18 is formed, for example, by sputtering. The source/drain electrode layer 18 is formed by depositing the above-described materials over the entire surface of the planarizing film 17 in such a manner as to cover the bottom surfaces of the contact holes H1 to H3. Then, as illustrated in FIG. 2G, the source/drain electrode layer 18 is patterned by photolithography using the unshown photomask M4. More specifically, the source/drain electrode layer 18 is divided for each of the regions 10B1, 10C1 and 10D1 and shaped into a desired form. This allows for the transistor section 10B, the capacitor section 10C and the interconnect contact section 10D to be formed on the substrate 11.

Figure 2H:
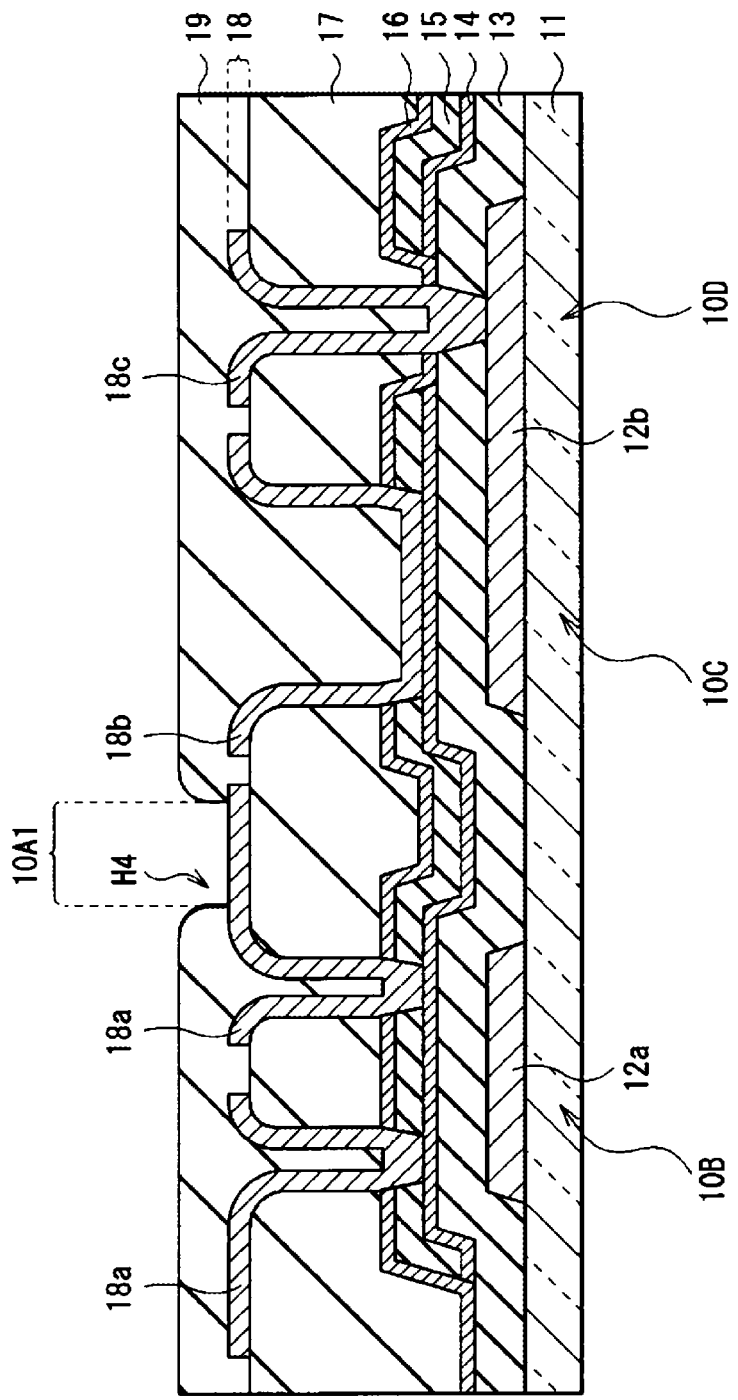
FIG. 2H is a diagram illustrating a step continued from FIG. 2G.

Next, the pixel isolation film 19 made of the above-described materials is formed, for example, by coating on the source/drain electrode layer 18 above the entire surface of the substrate 11. Then, as illustrated in FIG. 2H, the pixel isolation film 19 is patterned by photolithography using the unshown photomask M5. More specifically, the opening H4 is formed in a region 10A1 (region for the source/drain electrode 18a acting as an anode electrode) for the light-emitting section 10A. The drive substrate 11A is manufactured as described above.

Then, the functional layer 20 is formed on the drive substrate 11A, for example, by vacuum deposition, followed by the formation of the common electrode 21 made of the above-described materials, for example, by sputtering. Next, after the formation of the protective layer 22, the sealing substrate 23 is attached to the protective layer 22, thus completing the manufacture of the display device 1A shown in FIG. 1.

[Action and Effect]

When a drive current commensurate with the video signal of each of red, green and blue is applied to each of the red, green and blue pixels in the display device 1A, electrons and holes are injected into the functional layer 20 via the source/drain electrode layer 18 serving as an anode and the common electrode 21 serving as a cathode. The electrons and holes respectively recombine in the organic EL layer included in the functional layer 20, thus emitting light. The display device 1A displays full color RGB images as described above.

In the present embodiment, the gate electrode 12a and the electrode layer 12b are formed on the substrate 11, followed by the formation of the laminated film 24 including the semiconductor layer 14, the first protective film 15, the second protective film 16, the planarizing film 17, the source/drain electrode layer 18 and the pixel isolation film 19 on or above the gate electrode 12a with the gate insulating film 13 sandwiched therebetween by photolithography techniques in the manufacturing process of the display device 1A (drive substrate 11A) described above. Then, the functional layer 20 including the organic EL layer and the common electrode 21 are formed in this order. In the step of forming the laminated film 24, two or more layers are patterned all together in at least part of the laminated film 24. For example, the first protective film 15 and the semiconductor layer 14 are patterned all together using the photomask M2. Further, the second protective film 16 and the first protective film 15 are patterned all together in the regions 10B1 and 10C1, and the second protective film 16 and the gate insulating film 13 are patterned all together in the region 10D1 using the patterned planarizing film 17 as a mask, thus forming the contact holes H1 to H3.

Further, the source/drain electrode layer 18 is formed on the planarizing film 17 using the contact hole H3 formed as a result of the patterning of two films at the same time, thus making it possible to use the source/drain electrode layer 18 as an anode electrode. It is also possible to form the capacitor section 10C and the interconnect contact section 10D, i.e., the sections necessary for driving the pixels, in the same step as that of forming the transistor section 10B using the contact holes H2 and H1.

Figure 3C:
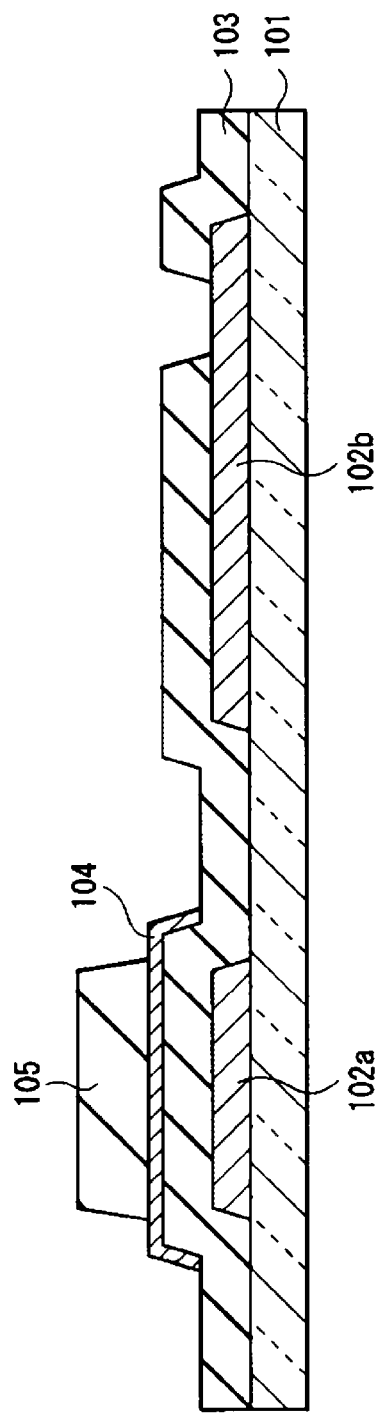
FIGS. 3C and 3D are diagrams illustrating steps continued from FIGS. 3A and 3B.

Here, as a comparative example of the present embodiment, FIGS. 3A to 3H illustrate the manufacturing method of a drive substrate using nine photomasks in the photolithography process in order of the steps. That is, one photomask is used during the formation of the gate electrode, and a total of eight photomasks are used in the steps from the formation of the semiconductor layer to that of the pixel isolation film in a comparative example. More specifically, a gate electrode 102a and an electrode layer 102b are formed in selective regions on a substrate 101 using an unshown photomask M101, followed by the successive formation of a gate insulating film 103, a semiconductor layer 104 and a first protective film 105. Then, as illustrated in FIG. 3A, the first protective film 105 is patterned in the form of an island using an unshown photomask M102, followed by the patterning of the semiconductor layer 104 in the form of an island using an unshown photomask M103 as illustrated in FIG. 3B.

Figure 3D:
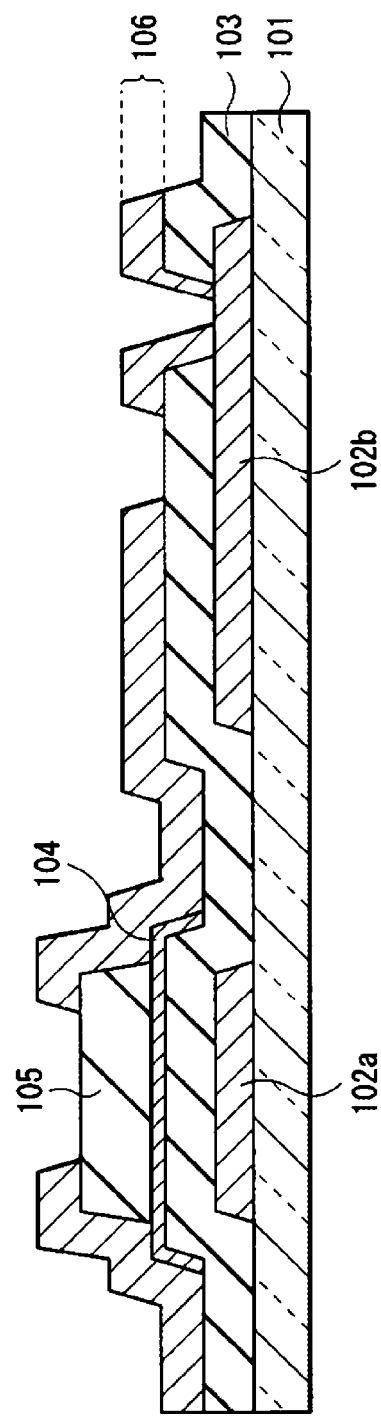
Figure 3E:
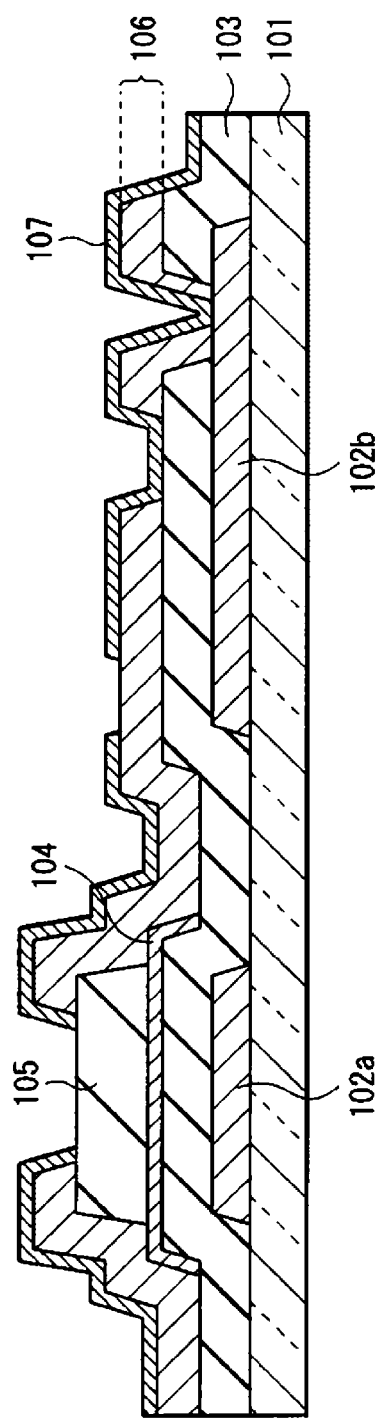
FIG. 3E is a diagram illustrating a step continued from FIGS. 3C and 3D.
Figure 3F:
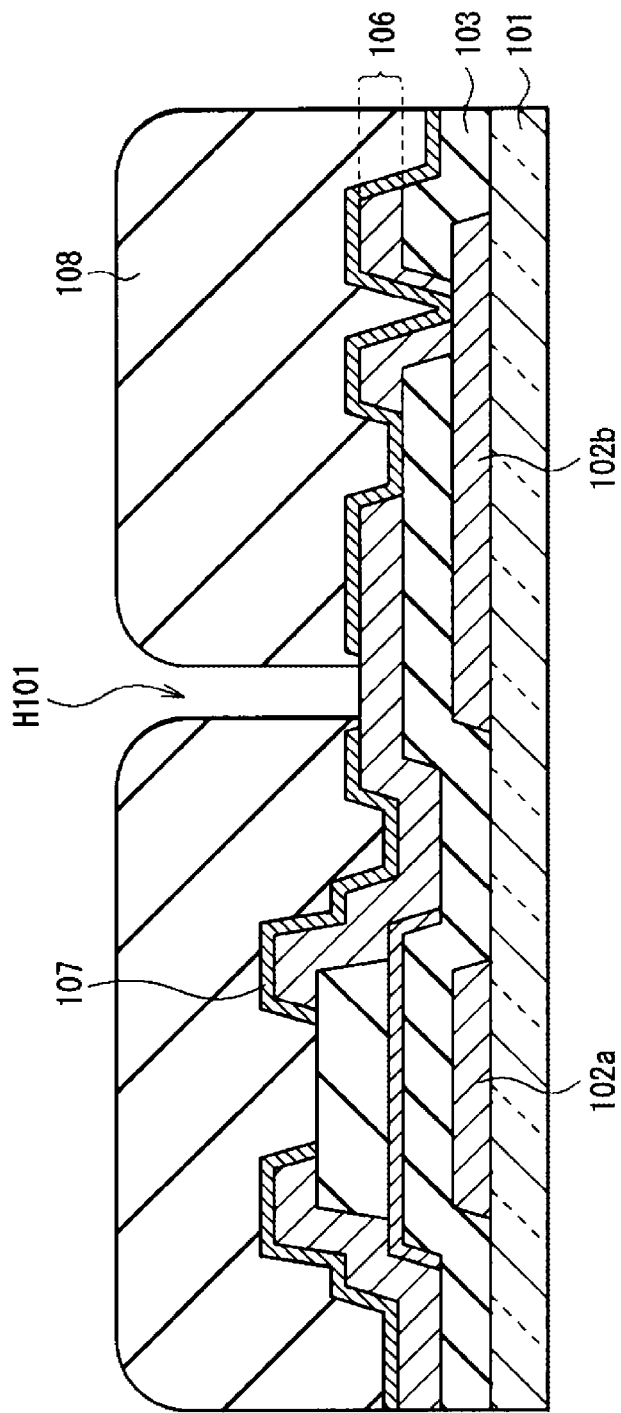
FIG. 3F is a diagram illustrating a step continued from FIG. 3E.
Figure 3G:
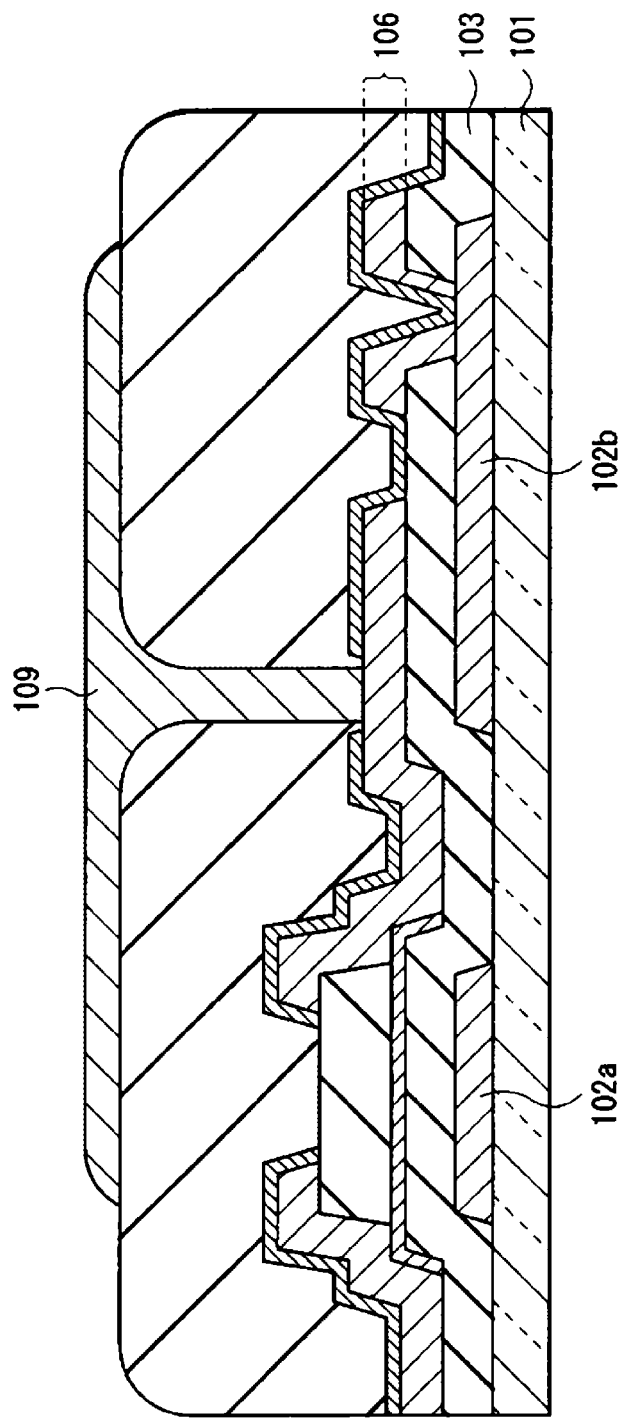
FIG. 3G is a diagram illustrating a step continued from FIG. 3F.
Figure 3H:
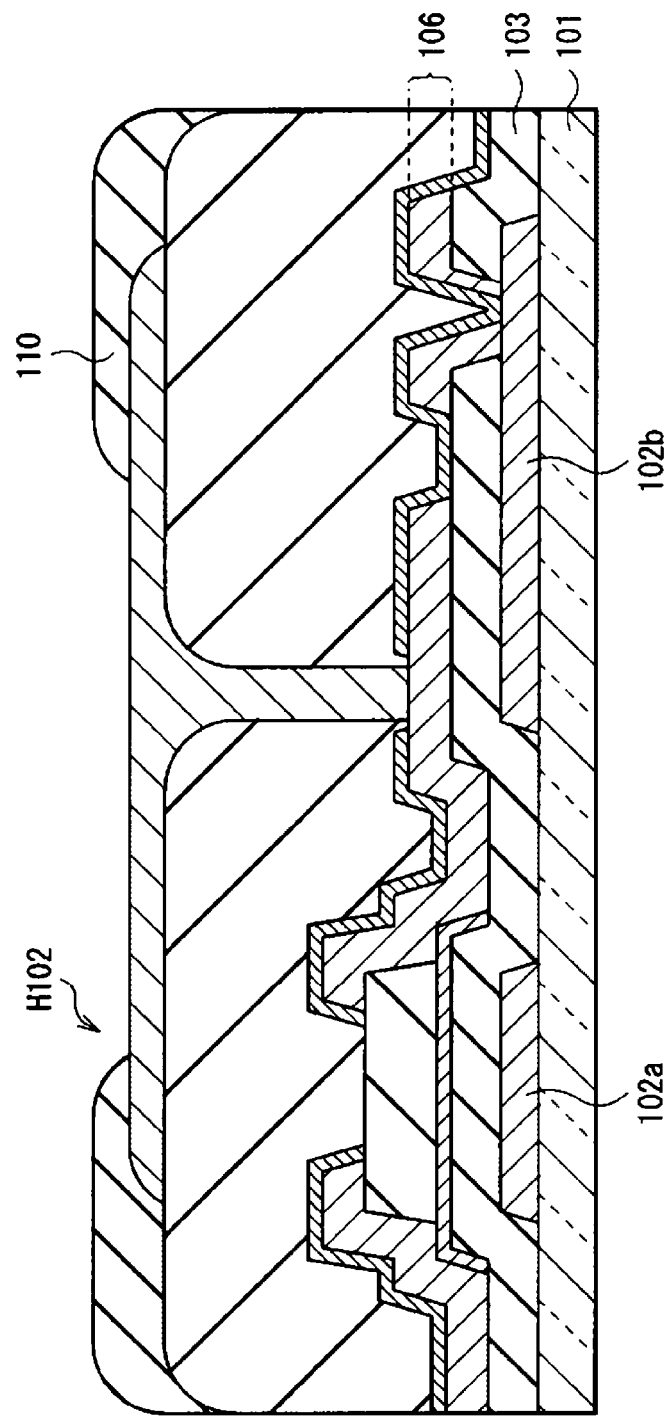
FIG. 3H is a diagram illustrating a step continued from FIG. 3G.

Next, as illustrated in FIG. 3C, the gate insulating film 103 is patterned using an unshown photomask M104, followed by the formation of a source/drain electrode 106. Then, as illustrated in FIG. 3D, the source/drain electrode 106 is patterned using an unshown photomask M105. Next, a second protective film 107 is formed, followed by the patterning of the same film 107 using an unshown photomask M106 as illustrated in FIG. 3E. Next, a planarizing film 108 is formed above the entire surface of the substrate, followed by the patterning of the planarizing film 108 using an unshown photomask M107 as illustrated in FIG. 3F, thus allowing for a contact hole H101 communicating with the source/drain electrode 106 to be formed. Next, an anode electrode 109 is formed in such a manner as to fill the contact hole H101, followed by the patterning of the anode electrode 109 using an unshown photomask M108 as illustrated in FIG. 3G. Finally, a pixel isolation film 110 is formed above the entire surface of the substrate, followed by the patterning of the pixel isolation film 110 using an unshown photomask M109 as illustrated in FIG. 3H, thus forming an opening H102 adapted to partition the light-emitting region.

In the above comparative example, each film is patterned by photolithography to manufacture the drive substrate. Therefore, a total of nine photomasks are used, thus resulting in more consumption of photoresist and other materials, higher cost and a larger number of film formation steps.

In contrast, the present embodiment changes for the better the configuration of the layers making up the laminated film 24 and the order thereof, thus ensuring a reduced number of times of patterning by photolithography.

Figure 4:
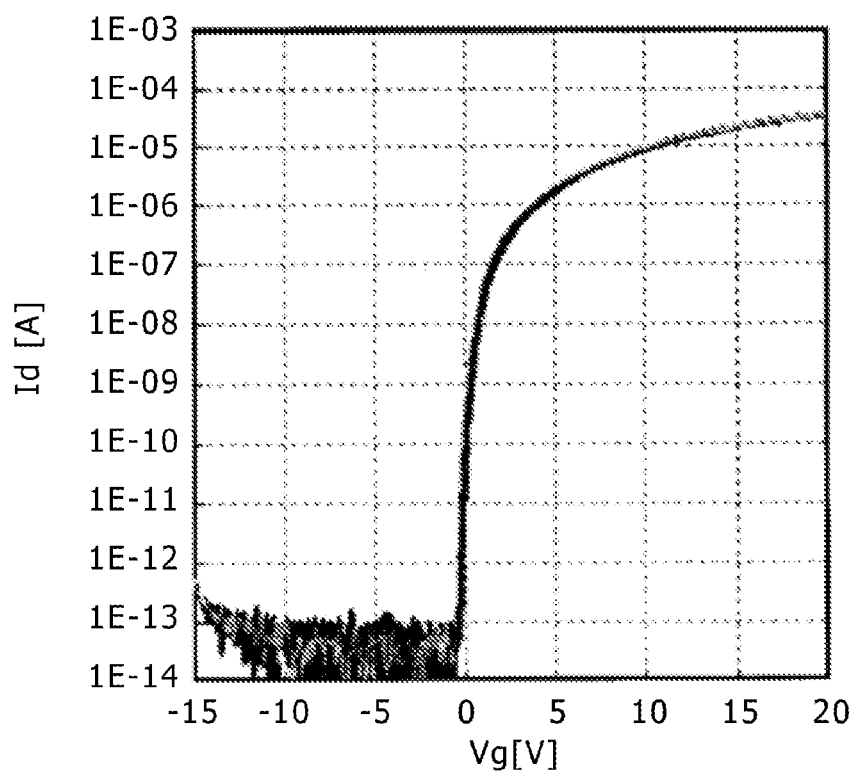
FIG. 4 is a diagram illustrating the current-voltage characteristic of the embodiment.

FIG. 4 illustrates the voltage-current characteristic (relationship between a gate voltage Vg and drive current Id) of the transistor section 10B in the drive substrate 11A manufactured using five photomasks as described in the present embodiment. Thus, even if the order of stacking the layers such as the source/drain electrode layer 18 and the planarizing film 17 is changed, the first protective film 15 and the second protective film 16 are provided on and above the semiconductor layer 14 (an etch stopper structure is achieved), thus allowing for the formation of highly reliable TFTs.

As described above, in the present embodiment, at least two or more layers of the laminated film 24 are patterned all together in the step of forming the same film 24. Here, the first protective film 15 and the semiconductor layer 14 are patterned all together using, for example, the photomask M2. Further, etching is performed using the planarizing film 17 as a mask, thus forming the contact holes H1 to H3 in the regions 10B1, 10C1 and 10D1 all together. This contributes to less consumption of photomasks, photoresist and other materials and a smaller number of steps in the manufacturing process. This allows for manufacturing of a display device by a low-cost and simple process.

Second Embodiment

A description of a display device (display device 1B) according to a second embodiment of the present disclosure will be given next. In the description given below, the same components as those of the display device 1A according to the first embodiment are denoted by the same reference symbols, and the description will be omitted as appropriate.

[Configuration of the Display Device 1B]

FIG. 5 illustrates the cross-sectional structure of the display device 1B. The display device 1B is an active matrix type organic EL display as is the display device 1A according to the first embodiment, and includes the functional layer 20, the common electrode 21, the protective layer 22 and the sealing substrate 23 on a drive substrate 11B. Further, in the functional layer 20, a region for a opening H4 of a pixel isolation film 19A which will be described later serves as a light-emitting section 30A.

In the drive substrate 11B, the transistor section 10B, the capacitor section 10C and the interconnect contact section 10D are also provided for each pixel on the substrate 11 to drive the pixel in the present embodiment. Further, the patterns of the transistor section 10B, the capacitor section 10C and the interconnect contact section 10D are formed on the substrate 11 by a thin film formation process based on photolithography techniques.

Further, in the laminated film 24, the contact hole H3 and a contact hole H5 are provided in the transistor section 10B and the capacitor section 10C to penetrate a planarizing film 17A, the second protective film 16 and the first protective film 15. The contact hole H1 is provided in the interconnect contact section 10D to penetrate the planarizing film 17A, the second protective film 16 and the gate insulating film 13. Still further, the source/drain electrode layer 18 is formed on the planarizing film 17A in such a manner as to fill the contact holes H1, H3 and H5.

It should be noted, however, that part (14a) of the semiconductor layer 14 is exposed from the planarizing film 17A and the pixel isolation film 19A in the region for the light-emitting section 30A in the present embodiment, and that the functional layer 20 is provided on and in contact with the exposed region of the semiconductor layer 14. That is, in the present embodiment, the region 14a of the semiconductor layer 14 serves as a display pixel electrode (e.g., anode electrode). The region 14a has been treated for reduced resistance and therefore shows a resistance value suitable for use as a pixel electrode.

It should be noted that the source/drain electrode layer 18 is divided into segments for each of the transistor section 10B, the capacitor section 10C and the interconnect contact section 10D, as with the first embodiment. In the present embodiment, however, the same layer 18 is removed from the region for the light-emitting section 30A by the patterning step which will be described later.

The display device 1B may be a top emission or bottom emission display device as with the first embodiment. It should be noted, however, that if the display device 1B is a top emission display device, the gate electrode 12a (and electrode layer 12b) is used as a reflective electrode. In this case, it is preferable to stack an AlNd alloy as the gate electrode 12a. Alternatively, if the display device 1B is a bottom emission display device, the gate electrode 12a (and electrode layer 12b) should preferably be separated as far as possible from the light-emitting section 30A. It should be noted that if the display device 1B is a bottom emission display device, it is possible to take advantage of the transparency of the oxide semiconductor, thus making it possible to extract emitted light from under the substrate 11 without any problem.

[Manufacturing Method]

The display device 1B as described above can be manufactured, for example, as described below. First, the pattern of the drive substrate 11B (gate electrode 12a and laminated film 24) is formed using the photolithography technique as described above.

It should be noted, however, that a total of four photomasks are used in such a photolithography process in the present embodiment. Going into more detail, one photomask (M1) is used to pattern the gate electrode 12a (and electrode layer 12b), and a total of three photomasks (M2, M3A and M4A) are used to pattern the laminated film 24 (semiconductor layer 14, first protective film 15, second protective film 16, planarizing film 17A, source/drain electrode layer 18 and pixel isolation film 19A). More specifically, the drive substrate 11B is manufactured by the following procedure.

That is, the pattern of the gate electrode 12a (and electrode layer 12b) is formed by photolithography using the unshown photomask M1 in the same manner as in the first embodiment. Next, the gate insulating film 13, the semiconductor layer 14 and the first protective film 15 are formed in this order in the same manner as in the first embodiment. Then, the first protective film 15 and the semiconductor layer 14 are patterned all together by photolithography using the unshown photomask M2 in the same manner as in the first embodiment, thus forming the contact hole H1a in the region 10D1. Next, the second protective film 16 and the planarizing film 17A are formed above the entire surface of the substrate 11 in the same manner as in the first embodiment.

Figure 6A:
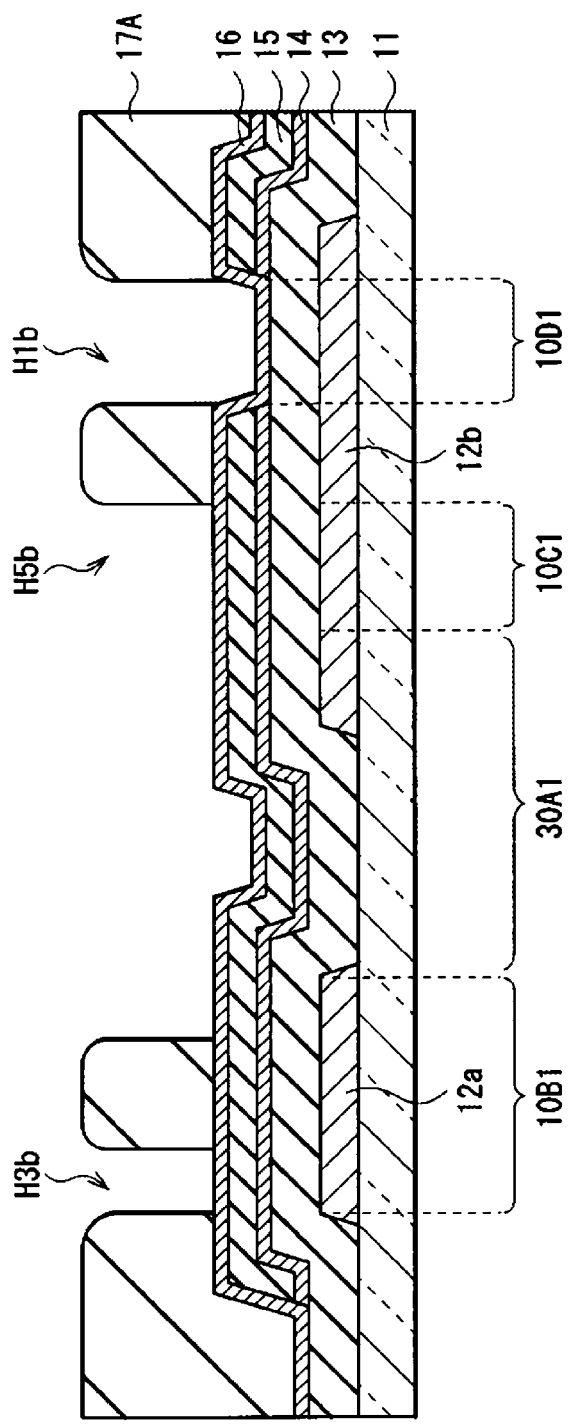
FIG. 6A is a diagram illustrating the manufacturing method of the display device shown in FIG. 5 in order of the steps.

Then, as illustrated in FIG. 6A, the planarizing film 17A is patterned by photolithography using the unshown photomask M3A. At this time, the contact hole H3b is formed in the region 10B1 for the transistor section 10B in the same manner as in the first embodiment, thus exposing the surface of the second protective film 16. Further, the contact hole H1b is also formed in the region 10D1 of the planarizing film 17A for the interconnect contact section 10D, thus exposing the surface of the second protective film 16. A contact hole H5b is formed to extend from the region 10C1 for the capacitor section 10C to a region 30A1 for the light-emitting section 30A. That is, the contact holes H1b, H5b and H3b adapted to act as mask openings in the next step are formed in the regions 10B1, 10C1, 10D1 and 30A1.

Figure 6B:
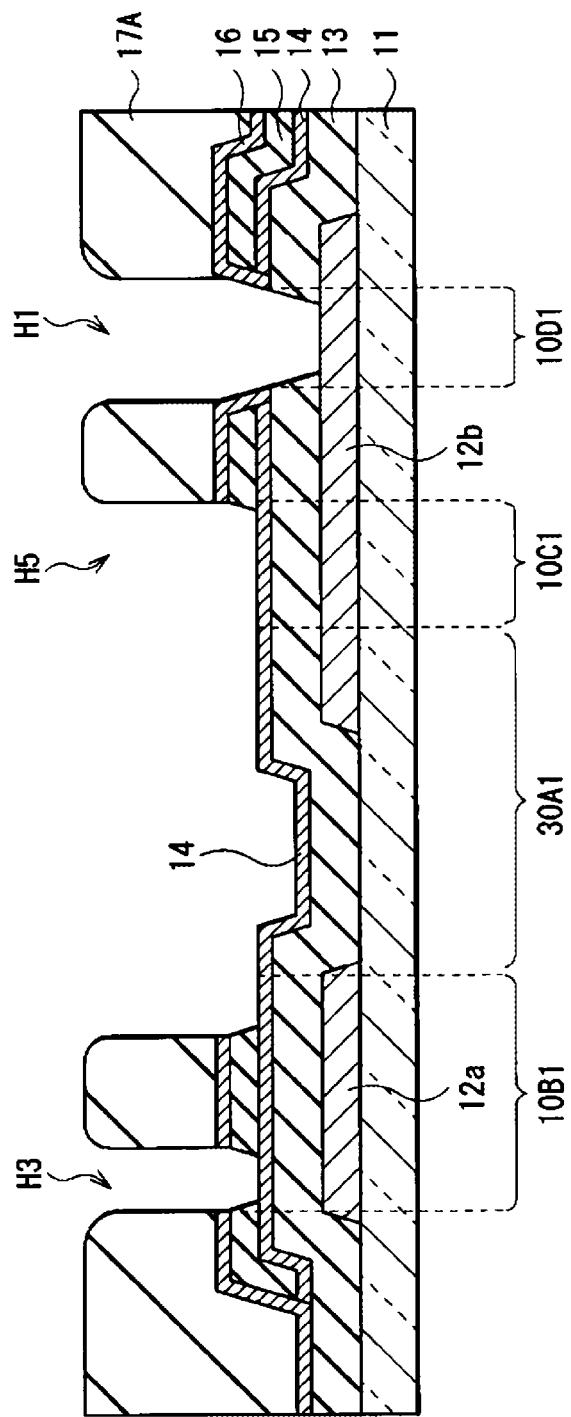
FIG. 6B is a diagram illustrating a step continued from FIG. 6A.

Next, as illustrated in FIG. 6B, dry etching is, for example, performed using the patterned planarizing film 17 as a mask, thus removing selective regions from the second protective film 16 and the first protective film 15 all together in the regions 10B1, 10C1 and 30A1 and thereby exposing the surface of the semiconductor layer 14. This allows for the contact holes H3 and H5 to be formed that penetrate the planarizing film 17A, the second protective film 16 and the first protective film 15. The contact hole H1 is formed in the region 10D1 to penetrate the second protective film 16 and the gate insulating film 13 in the same manner as in the first embodiment.

Figure 6C:
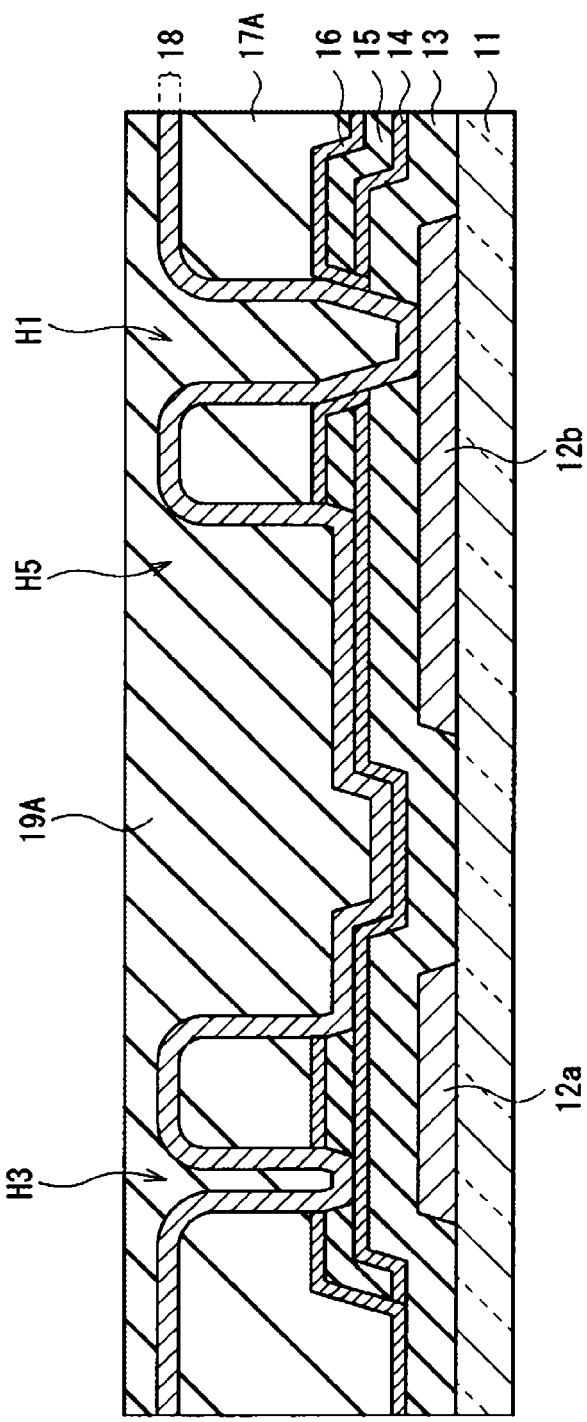
FIG. 6C is a diagram illustrating a step continued from FIG. 6B.

Next, after the formation of the contact holes H1, H3 and H5, the source/drain electrode layer 18 is formed, for example, by sputtering as illustrated in FIG. 6C. The same layer 18 is formed by depositing the above-described materials over the entire surface of the planarizing film 17A in such a manner as to cover the bottom surfaces of the contact holes H1, H3 and H5. Next, the pixel isolation film 19A made of the above-described materials is formed, for example, by coating on the source/drain electrode layer 18 above the entire surface of the substrate 11.

Figure 6D:
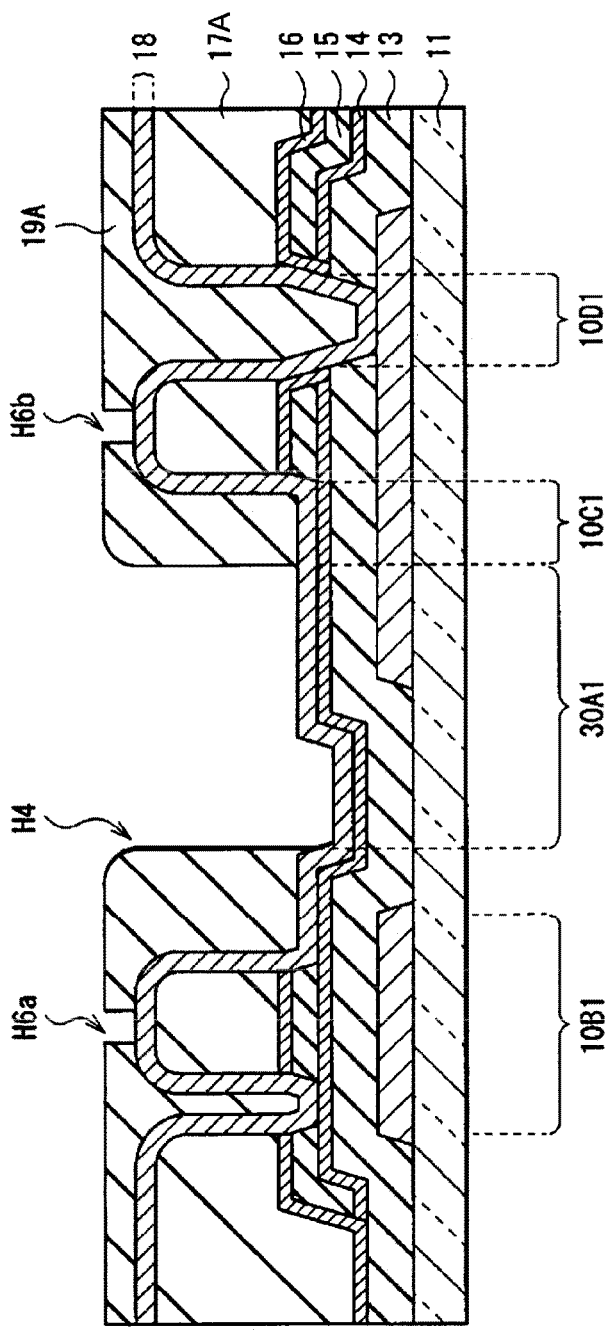
FIG. 6D is a diagram illustrating a step continued from FIG. 6C.

Next, as illustrated in FIG. 6D, the pixel isolation film 19A is patterned by photolithography using the unshown photomask M4A. More specifically, the opening H4 is formed in the region 30A1 for the light-emitting section 30A. At the same time, an isolation groove H6a is formed in the region 10B1, and an isolation groove H6b is formed between the regions 10C1 and 10D1.

Figure 6E:
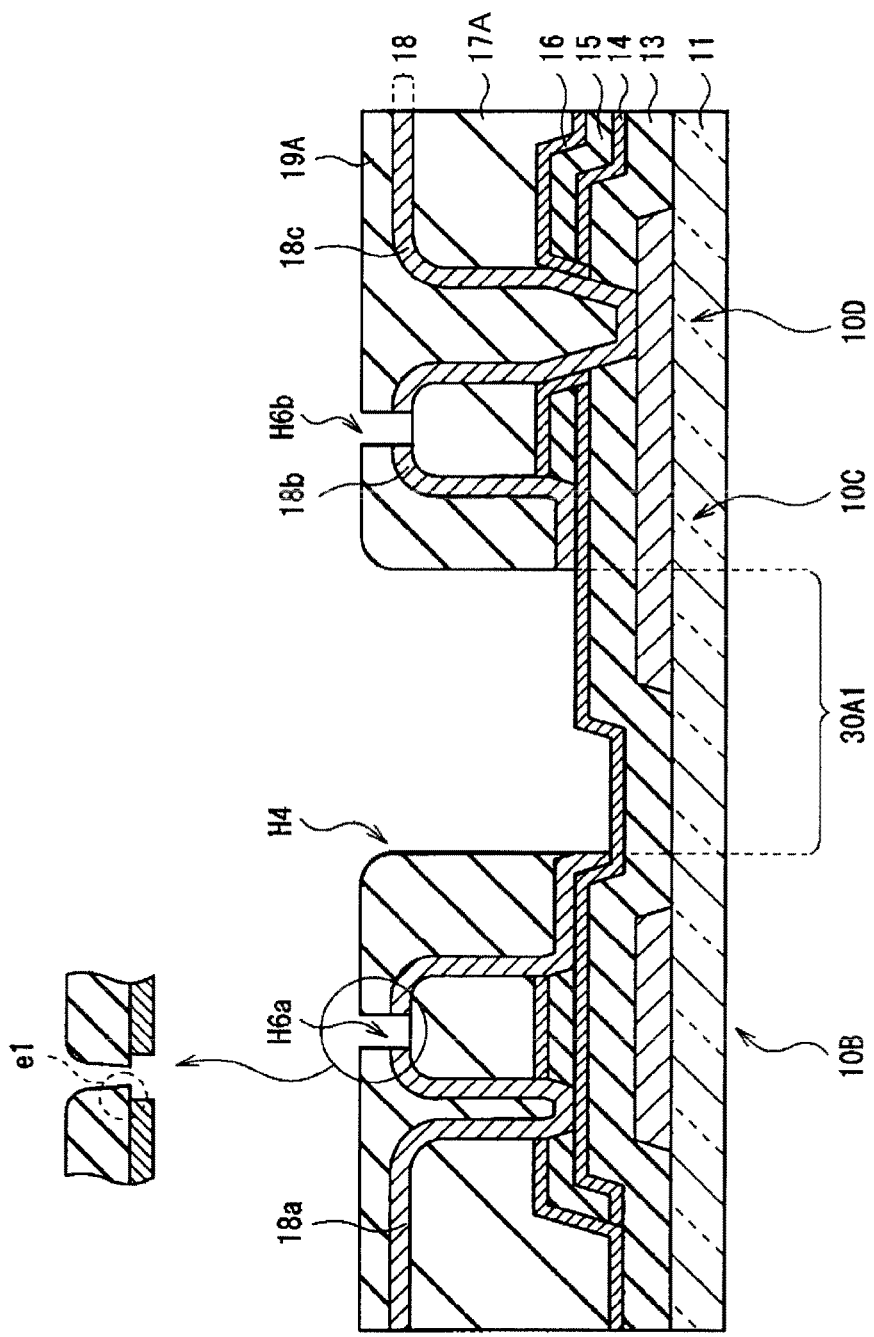
FIG. 6E is a diagram illustrating a step continued from FIG. 6D.

Next, as illustrated in FIG. 6E, wet etching is, for example, performed using the patterned pixel isolation film 19A as a mask, thus selectively removing the region 30A1 of the source/drain electrode 18 for the opening H4 and the regions for the isolation grooves H6a and H6b. That is, the semiconductor layer 14 is exposed in the region 30A1. At the same time, the source/drain electrode layer 18 is divided at several predetermined locations. This allows for the transistor section 10B, the capacitor section 10C and the interconnect contact section 10D to be formed on the substrate 11.

It should be noted that, after the patterning of the source/drain electrode layer 18 using the pixel isolation film 19A as a mask, the regions of the pixel isolation film 19A near the isolation grooves H6a and H6b are in a so-called overhung shape (shape e1 in which the pixel isolation film 19A hangs over the edge of the source/drain electrode 18a as illustrated in an enlarged view of FIG. 6E) as a result of etching. Such an overhung shape may be left unremoved. This makes it less likely that leaks between the pixels may occur during vapor deposition of the functional layer 20.

Alternatively, after the patterning of the source/drain electrode layer 18, the pixel isolation film 19A is subjected to reflow, thus bringing the pixel isolation film 19A into close contact with the planarizing film 17A in such a manner as to fill the isolation grooves H6a and H6b. This makes it possible to cover the electrode edge, a possible cause of deterioration of the organic material (including shorting between the anode and cathode resulting from faulty coverage of the light-emitting layer), with an insulating material, thus providing improved reliability. Here, a case is taken as an example in which such reflow is performed.

Figure 7:
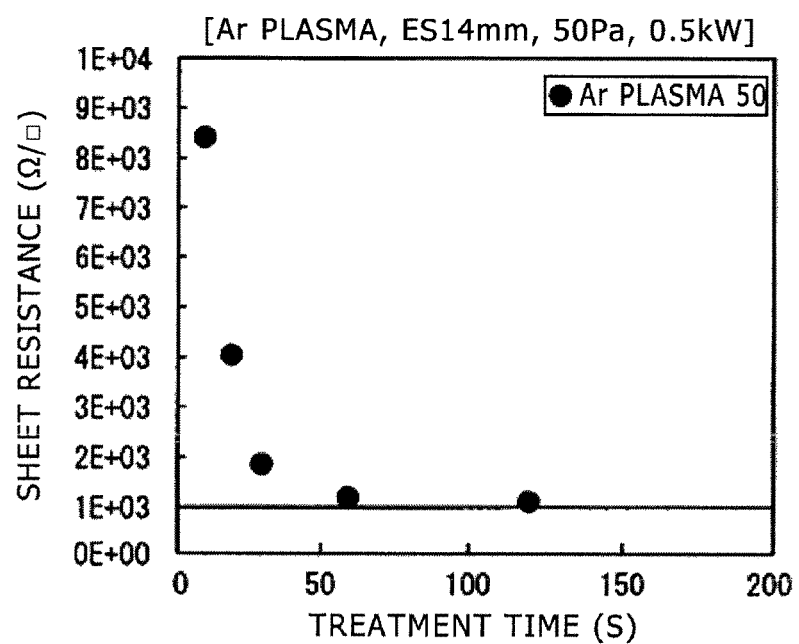
FIG. 7 is a characteristic diagram illustrating the relationship between treatment time and sheet resistance in a resistance reduction treatment (argon plasma treatment)

Next, as illustrated in FIG. 6F, the exposed portion of the semiconductor layer 14 is treated for reduced resistance. More specifically, a plasma treatment using Ar, $H_2$ or $NH_3$ as a reactive gas should preferably be performed so as to reduce the sheet resistance, for example, to 5 k$\Omega$/sq. or less. Here, FIG. 7 illustrates the relationship between the treatment time and sheet resistance in an Ar plasma treatment. Thus, the sheet resistance has been reduced to 1E+3 [k$\Omega$/sq.]. This allows for the exposed portion (14a) of the semiconductor layer 14 to act as an anode electrode. The drive substrate 11B is manufactured as described above.

Then, the functional layer 20, the common electrode 21 and the protective layer 22 are formed in this order on the drive substrate 11B in the same manner as in the first embodiment, after which the sealing substrate 23 is attached to the protective layer 22, thus completing the manufacturing of the display device 1B shown in FIG. 5.

[Action and Effect]

As described above, in the present embodiment, the gate electrode 12a and the electrode layer 12b are formed on the substrate 11, followed by the formation of the laminated film 24 including the semiconductor layer 14, the first protective film 15, the second protective film 16, the planarizing film 17A, the source/drain electrode layer 18 and the pixel isolation film 19A on or above the gate electrode 12a with the gate insulating film 13 sandwiched therebetween by photolithography techniques in the manufacturing process of the display device 1B (drive substrate 11B). Then, the functional layer 20 including the organic EL layer and the common electrode 21 are formed in this order. In the step of forming the laminated film 24, two or more layers are patterned all together in at least part of the laminated film 24. Here, for example, the first protective film 15 and the semiconductor layer 14 are patterned all together using the photomask M2 in the same manner as in the first embodiment. Further, the second protective film 16 and the first protective film 15 are patterned all together in the regions 10B1, 30A1 and 10C1, and the second protective film 16 and the gate insulating film 13 are patterned all together in the region 10D1 using the patterned planarizing film 17A as a mask, thus forming the contact holes H1, H3 and H5.

Further, the semiconductor layer 14 is partially exposed, and the exposed portion thereof is treated for reduced resistance in the contact hole H5 formed as a result of the patterning of two films at the same time, thus making it possible to use the part (14a) of the semiconductor layer 14 as an anode electrode. Still further, it is possible to form the capacitor section 10C and interconnect contact section 10D, i.e., the sections necessary for driving the pixels, in the same step as that of forming the transistor section 10B using part of the contact hole H5 and the contact hole H1.

That is, the present embodiment also changes for the better the configuration of the layers making up the laminated film 24 and the order thereof, thus ensuring a reduced number of times of patterning by photolithography as compared to the above-described comparative example. This contributes to less consumption of photomasks, photoresist and other materials and a smaller number of steps, thus allowing for manufacturing of a display device by a low-cost and simple process.

Third Embodiment

A description of a display device (display device 1C) according to a third embodiment of the present disclosure will be given next. In the description given below, the same components as those of the display device 1A according to the first embodiment are denoted by the same reference symbols, and the description will be omitted as appropriate.

[Configuration of the Display Device 1C]

Figure 8:
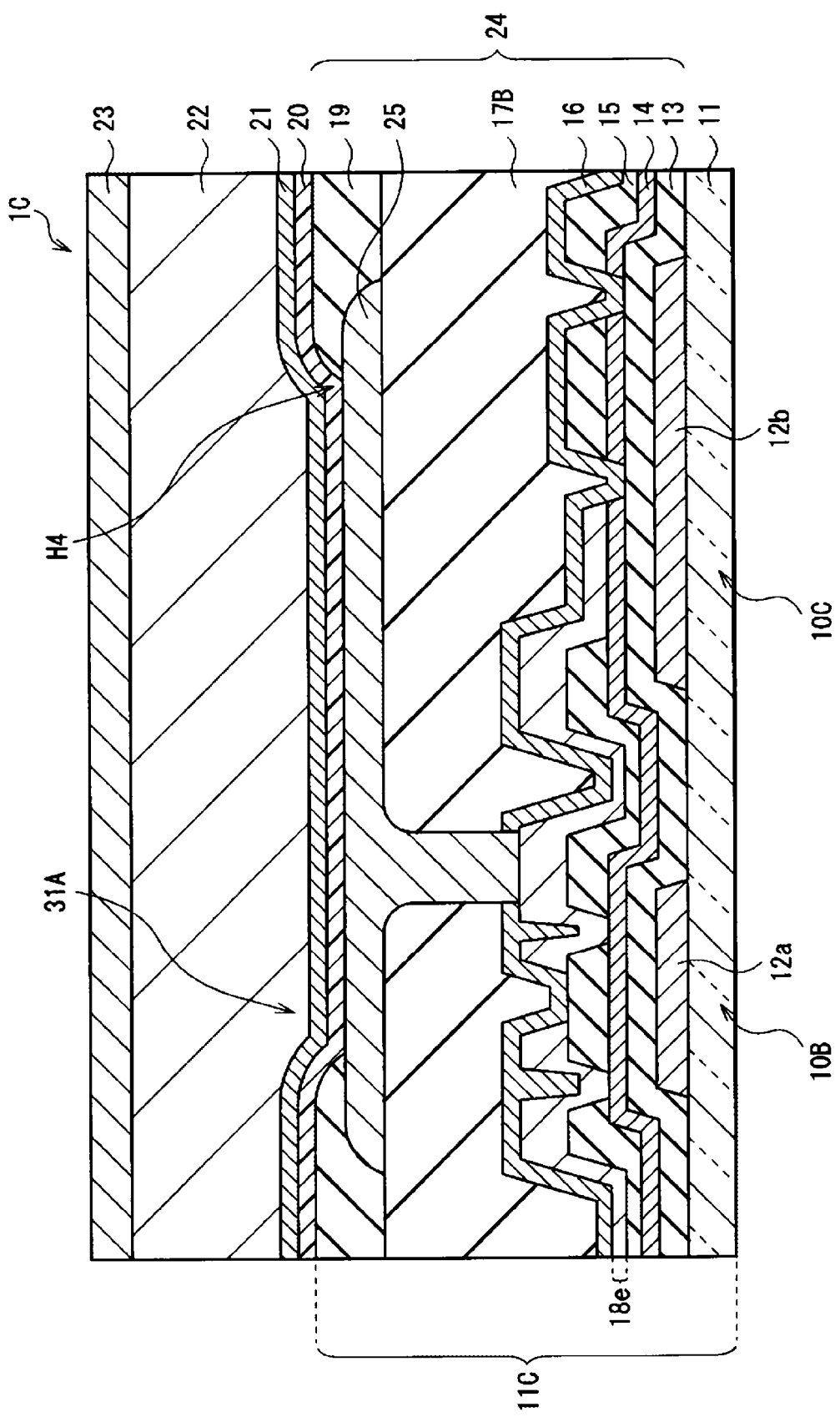
FIG. 8 illustrates the cross-sectional structure of a display device according to a third embodiment of the present disclosure.

FIG. 8 illustrates the cross-sectional structure of the display device 1C. The display device 1C is an active matrix type organic EL display as is the display device 1A according to the first embodiment and includes the functional layer 20, the common electrode 21, the protective layer 22 and the sealing substrate 23 on a drive substrate 11C. Further, in the functional layer 20, a region of the pixel isolation film 19 for the opening H4 serves as a light-emitting section 31A. The display device 1C may be a top emission or bottom emission display device as with the first embodiment.

In the drive substrate 11C, the transistor section 10B and the capacitor section 10C are also provided for each pixel on the substrate 11 to drive the pixel in the present embodiment. Further, the patterns of the transistor section 10B and the capacitor section 10C are formed on the substrate 11 by a thin film formation process based on photolithography techniques. It should be noted that, although not shown here, an interconnect contact section can be formed as follows. That is, an interconnect contact section can be formed by etching down to the surface of the electrode layer 12b during the etching using a planarizing film 17b which will be described later so as to provide a contact hole and forming an anode electrode 25 in such a manner as to fill the contact hole.

It should be noted, however, that, in the present embodiment, the laminated film 24 includes a source/drain electrode layer 18e and the second protective film 16 provided in this order on and above the first protective film 15, and that the planarizing film 17B is formed on the second protective film 16. Further, the anode electrode 25 electrically connected to the source/drain electrode layer 18e is separately provided on the planarizing film 17B. The opening H4 of the pixel isolation film 19 is formed on the anode electrode 25.

[Manufacturing Method]

The display device 1C as described above can be manufactured, for example, as described below. First, the pattern of the drive substrate 11C (gate electrode 12a and laminated film 24) is formed using the photolithography technique as described above.

It should be noted, however, that a total of six photomasks are used in such a photolithography process in the present embodiment. Going into more detail, one photomask (M1) is used to pattern the gate electrode 12a (and electrode layer 12b), and a total of five photomasks (M2B to M6B) are used to pattern the laminated film 24 (semiconductor layer 14, first protective film 15, source/drain electrode layer 18e, second protective film 16, planarizing film 17B, anode electrode 25 and pixel isolation film 19). More specifically, the drive substrate 11C is manufactured by the following procedure.

That is, the pattern of the gate electrode 12a (and electrode layer 12b) is formed by photolithography using the unshown photomask M1 in the same manner as in the first embodiment. Next, the gate insulating film 13, the semiconductor layer 14 and the first protective film 15 are formed in this order in the same manner as in the first embodiment. Then, the first protective film 15 is patterned by photolithography using the unshown photomask M2B as illustrated in FIG. 9A.

Next, the source/drain electrode layer 18e is formed. Then, the same layer 18e and the semiconductor layer 14 are patterned all together using the unshown photomask M3B as illustrated in FIG. 9B, thus forming a through-holes H7a and H7b in a region for the electrode layer 12b.

Figure 9D:
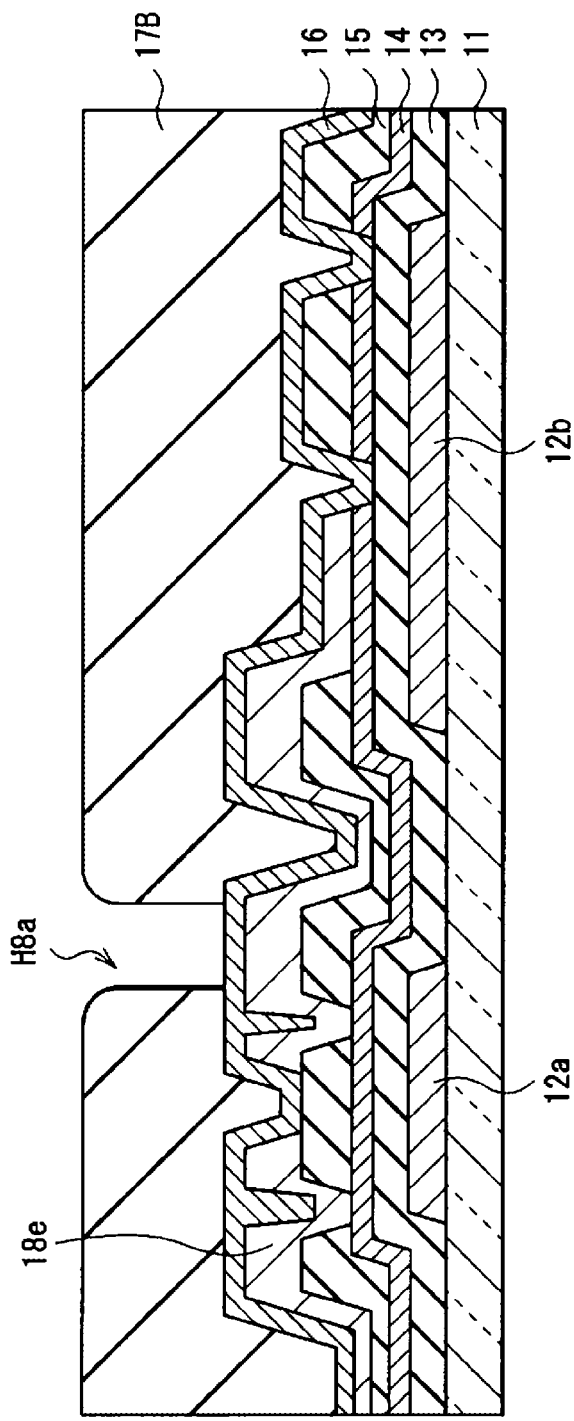
FIG. 9D is a diagram illustrating a step continued from FIG. 9C.

Then, as illustrated in FIG. 9C, the second protective film 16 and the planarizing film 17B are formed by the above-described method above the entire surface of the substrate. Next, the planarizing film 17B is patterned using the unshown photomask M4B as illustrated in FIG. 9D, thus forming a contact hole H8a adapted to act as a mask opening in the next step.

Next, as illustrated in FIG. 9E, the second protective film 16 is etched using the patterned planarizing film 17B as a mask. This exposes the surface of the source/drain electrode layer 18e, thus forming a contact hole H8 used to establish electrical connection with the anode electrode 25.

Figure 9G:
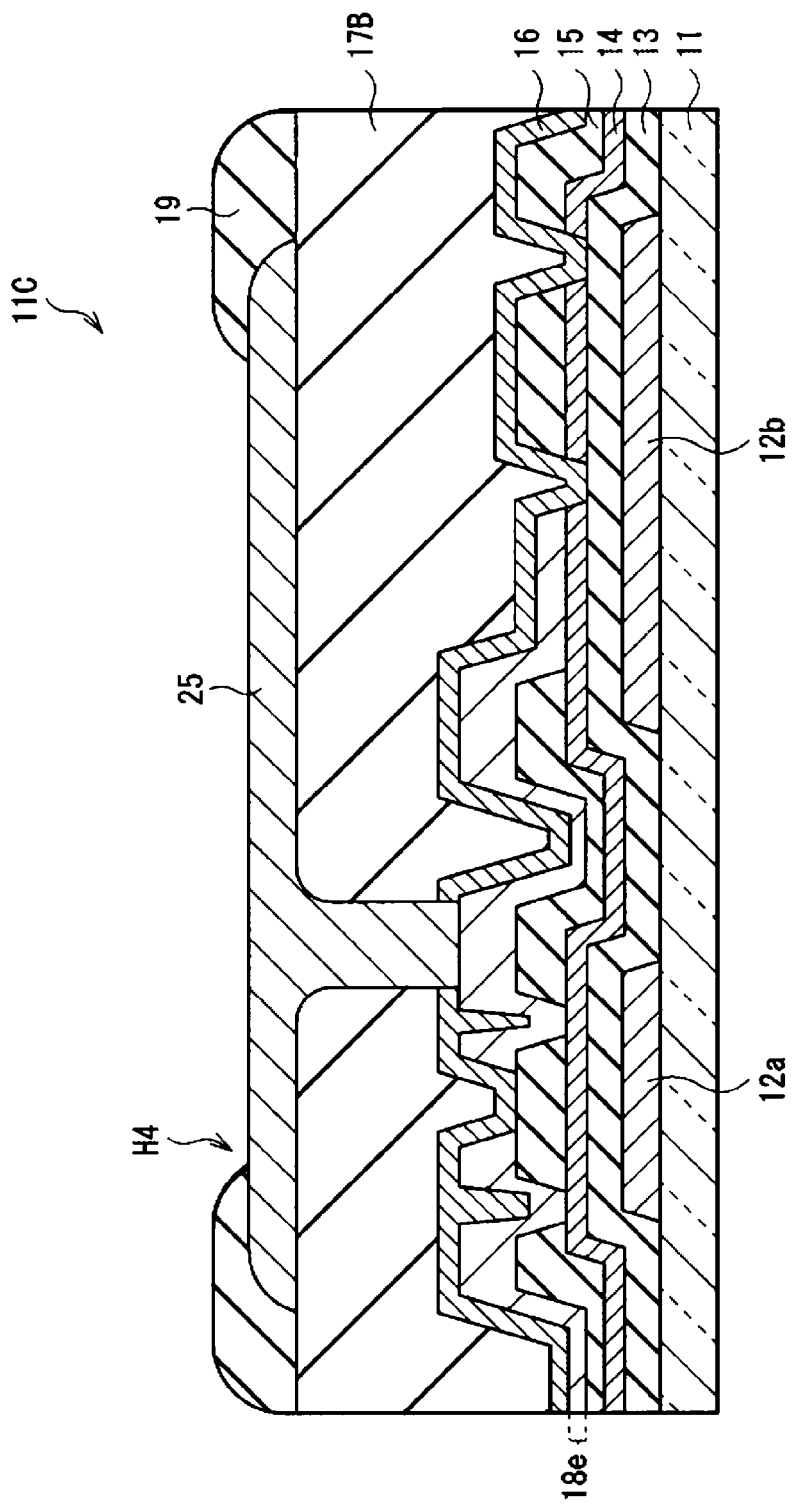
FIG. 9G is a diagram illustrating a step continued from FIG. 9F.

Next, the anode electrode 25 is formed in such a manner as to fill the contact hole H8, followed by the patterning of the same electrode 25 using the unshown photomask M5B as illustrated in FIG. 9F. Then, the pixel isolation film 19 is formed above the entire surface of the substrate, followed by the patterning of the same film 19 using the unshown photomask M6B as illustrated in FIG. 9G, thus forming the opening H4 adapted to partition the light-emitting region. The drive substrate 11C is manufactured as described above.

Then, the functional layer 20, the common electrode 21 and the protective layer 22 are formed in this order on the drive substrate 11C in the same manner as in the first embodiment, after which the sealing substrate 23 is attached to the protective layer 22, thus completing the manufacture of the display device 1C shown in FIG. 8.

[Action and Effect]

As described above, in the present embodiment, the gate electrode 12a and the electrode layer 12b are formed on the substrate 11, followed by the formation of the laminated film 24 including the semiconductor layer 14, the first protective film 15, the source/drain electrode layer 18e, the second protective film 16, the planarizing film 17B, the anode electrode 25 and the pixel isolation film 19 on or above the gate electrode 12a with the gate insulating film 13 sandwiched therebetween by photolithography techniques in the manufacturing process of the display device 1C (drive substrate 11C). Then, the functional layer 20 including the organic EL layer and the common electrode 21 are formed in this order. In the step of forming the laminated film 24, two or more layers are patterned all together in at least part of the laminated film 24. Here, for example, the source/drain electrode layer 18e and the semiconductor layer 14 are patterned all together using the photomask M3B (the through-holes H7a and H7b are formed to penetrate the source/drain electrode layer 18e and the semiconductor layer 14).

That is, the present embodiment also changes for the better the configuration of the layers making up the laminated film 24 and the order thereof, thus ensuring a reduced number of times of patterning by photolithography as compared to the above comparative example. This contributes to less consumption of photomasks, photoresist and other materials and a smaller number of steps, thus allowing for manufacture of a display device by a low-cost and simple process.

Fourth Embodiment

A description of a display device (display device 1D) according to a fourth embodiment of the present disclosure will be given next. In the description given below, the same components as those of the display device 1A according to the first embodiment or the display device 1C according to the third embodiment are denoted by the same reference symbols, and the description will be omitted as appropriate.

[Configuration of the Display Device 1D]

Figure 10:
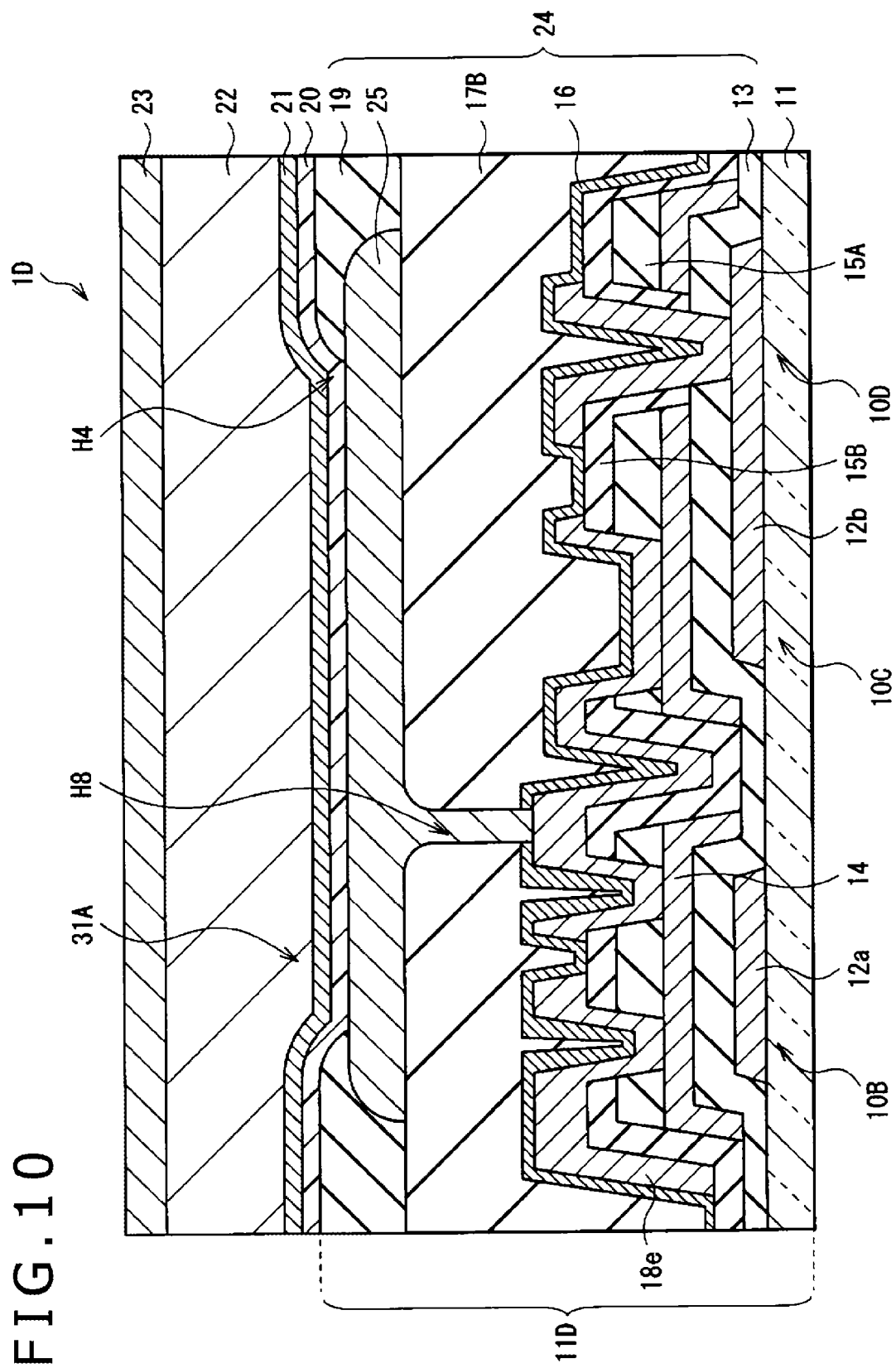
FIG. 10 illustrates the cross-sectional structure of a display device according to a fourth embodiment of the present disclosure.

FIG. 10 illustrates the cross-sectional structure of the display device 1D. The display device 1D is an active matrix type organic EL display as is the display device 1A according to the first embodiment and includes the functional layer 20, the common electrode 21, the protective layer 22 and the sealing substrate 23 on a drive substrate 11D. Further, in the functional layer 20, a region of the pixel isolation film 19 for the opening H4 serves as the light-emitting section 31A. The display device 1D may be a top emission or bottom emission display device as with the first embodiment.

The transistor section 10B, the capacitor section 10C and the interconnect contact section 10D are also provided for each pixel on the substrate 11 to drive the pixel in the present embodiment. Further, the patterns of the transistor section 10B, the capacitor section 10C and the interconnect contact section 10D are formed on the substrate 11 by a thin film formation process based on photolithography technique.

It should be noted, however, that, in the present embodiment, the laminated film 24 includes two first protective layers, namely, first protective films 15a and 15b, on the semiconductor layer 14, and that the source/drain electrode layer 18e and the second protective film 16 are provided in this order on and above the first protective film 15b. The planarizing film 17B is formed on the second protective film 16, and the anode electrode 25 electrically connected to the source/drain electrode layer 18e is separately provided on the planarizing film 17B. The opening H4 of the pixel isolation film 19 is formed on the anode electrode 25. The first protective films 15a and 15b are made, for example, of a silicon oxide as is the first protective film 15 in the first embodiment.

[Manufacturing Method]

The display device 1D as described above can be manufactured, for example, as described below. First, the pattern of the drive substrate 11D (gate electrode 12a and laminated film 24) is formed using the photolithography technique as described above.

It should be noted, however, that, in the present embodiment, a total of seven photomasks are used in such a photolithography process. Going into more detail, a photomask (M1) is used to pattern the gate electrode 12a (and electrode layer 12b), and a total of six photomasks (M2C to M7C) are used to pattern the laminated film 24 (semiconductor layer 14, first protective films 15a and 15b, source/drain electrode layer 18e, second protective film 16, planarizing film 17B, anode electrode 25 and pixel isolation film 19). More specifically, the drive substrate 11D is manufactured by the following procedure.

That is, the pattern of the gate electrode 12a (and electrode layer 12b) is formed by photolithography using the unshown photomask M1 in the same manner as in the first embodiment. Next, the gate insulating film 13 and the semiconductor layer 14 are formed in this order in the same manner as in the first embodiment. Then, the first protective film 15a is formed, for example, by CVD method, after which the first protective film 15a and the semiconductor layer 14 are patterned all together by photolithography using the unshown photomask M2C as illustrated in FIG. 11A, thus forming the contact hole H1a in the region 10D1 for the interconnect contact section 10D.

Figure 11C:
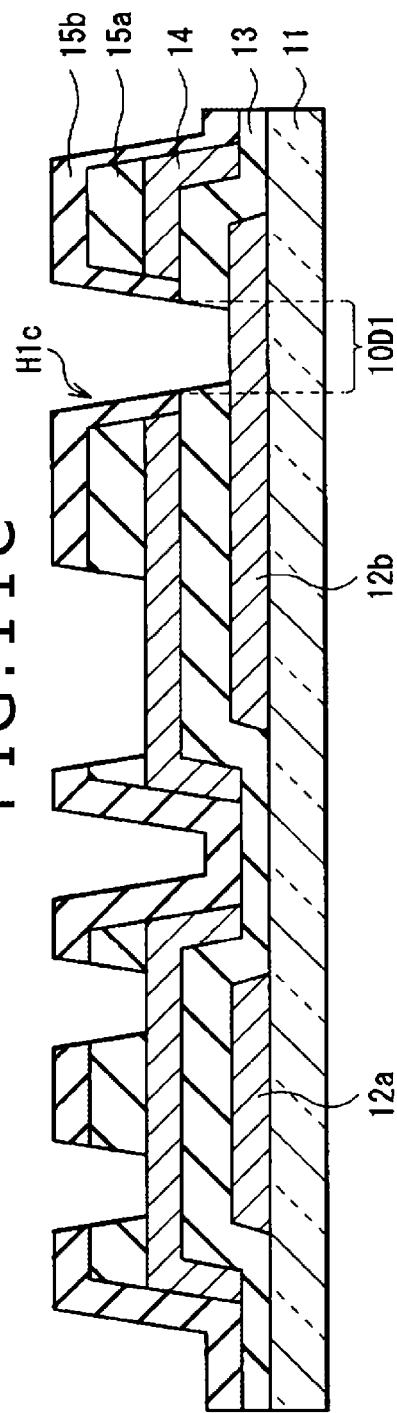
FIGS. 11C and 11D are diagrams illustrating steps continued from FIGS. 11A and 11B.

Next, as illustrated in FIG. 11B, the first protective film 15b is formed above the entire surface of the substrate, for example by CVD method. Then, as illustrated in FIG. 11C, the first protective films 15a and 15b are patterned all together using the unshown photomask M3C. At this time, the first protective film 15b and the gate insulating film 13 are patterned all together in the region 10D1, thus forming a through-hole H1c.

Figure 11D:
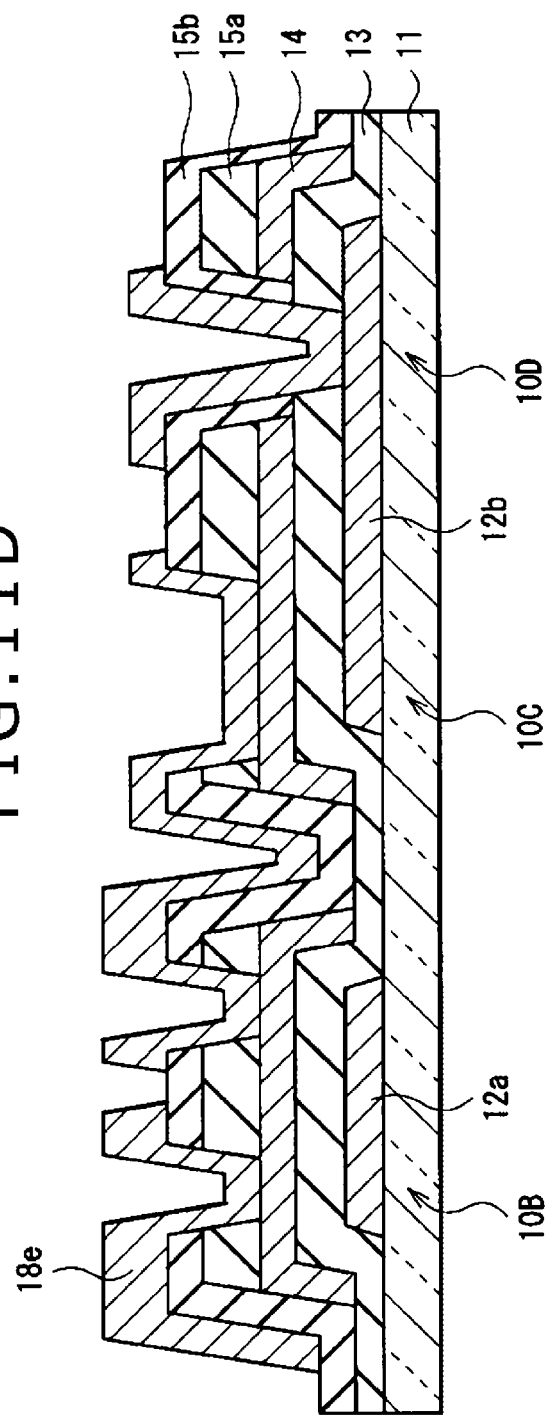

Next, the source/drain electrode layer 18e is formed. Then, the source/drain electrode layer 18e is patterned using the unshown photomask M4C as illustrated in FIG. 11D, thus dividing the same layer 18e into segments, one for each of the regions 10B1, 10C1 and 10D1 and forming the transistor section 10B, the capacitor section 10C and the interconnect contact section 10D.

Figure 11E:
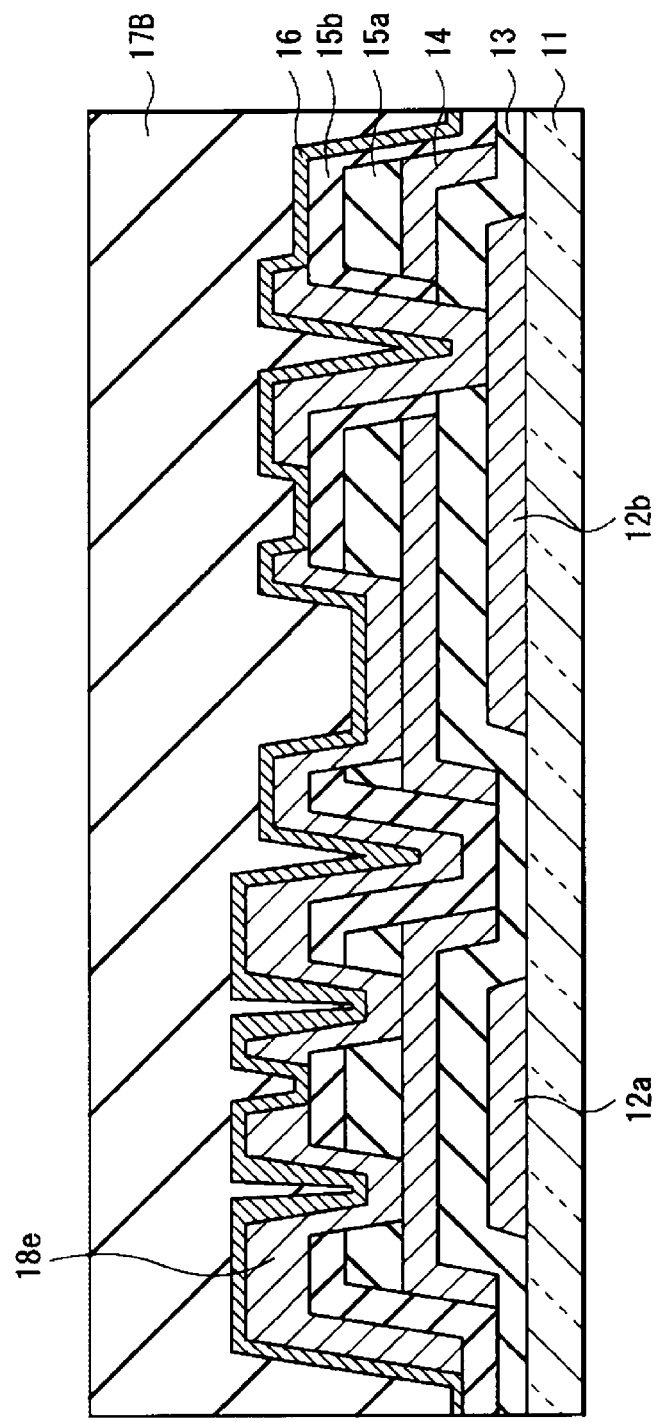
FIG. 11E is a diagram illustrating a step continued from FIGS. 11C and 11D.
Figure 11F:
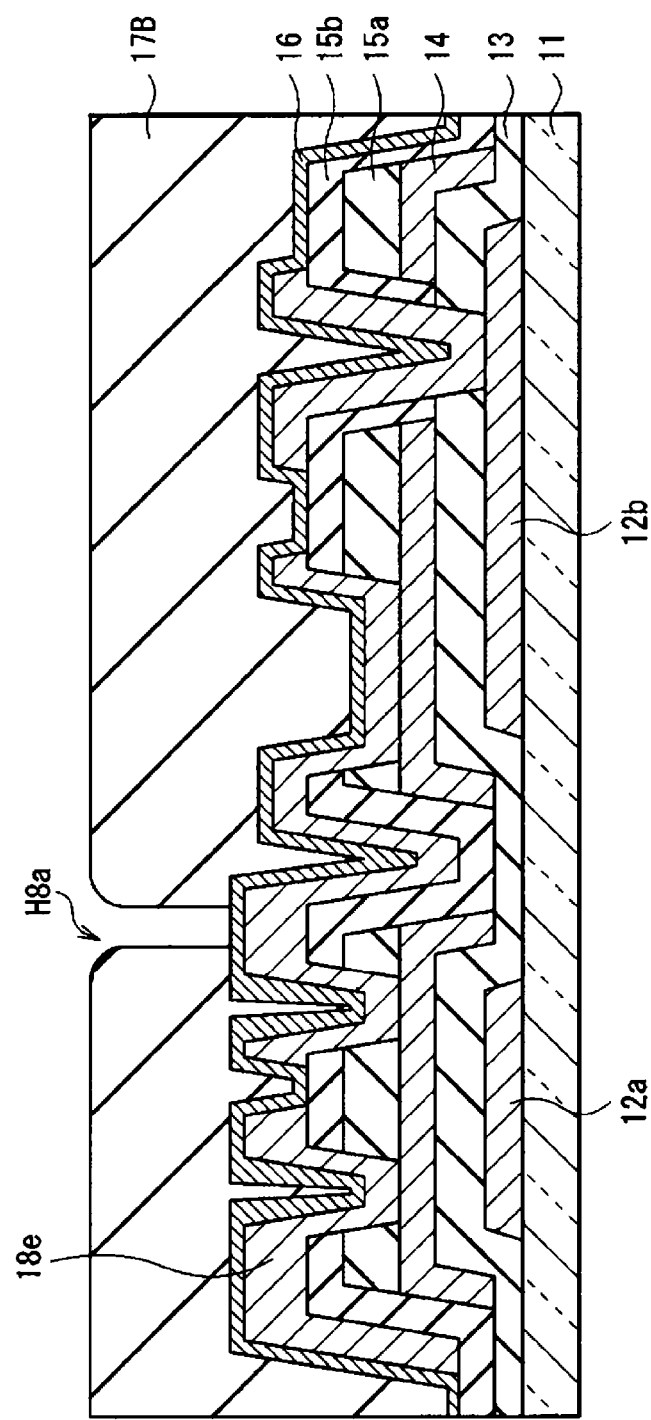
FIG. 11F is a diagram illustrating a step continued from FIG. 11E.

Then, as illustrated in FIG. 11E, the second protective film 16 and the planarizing film 17B are formed in this order by the above-described method above the entire surface of the substrate. Next, the planarizing film 17B is patterned using the unshown photomask M5C as illustrated in FIG. 11F, thus forming the contact hole H8a adapted to act as a mask opening in the next step.

Next, as illustrated in FIG. 11G, the second protective film 16 is etched using the patterned planarizing film 17B as a mask. This exposes the surface of the source/drain electrode layer 18e, thus forming the contact hole H8 used to establish electrical connection with the anode electrode 25.

Figure 11H:
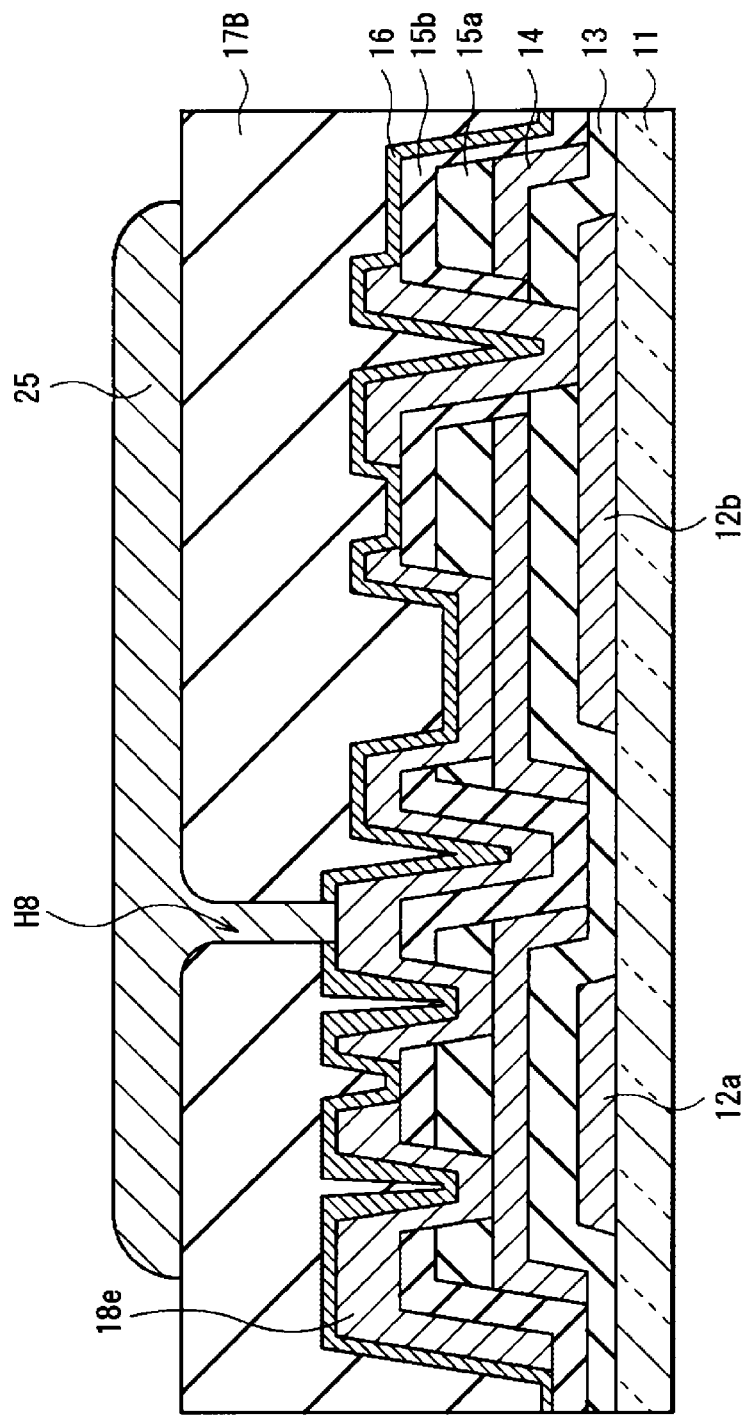
FIG. 11H is a diagram illustrating a step continued from FIG. 11G.
Figure 11I:
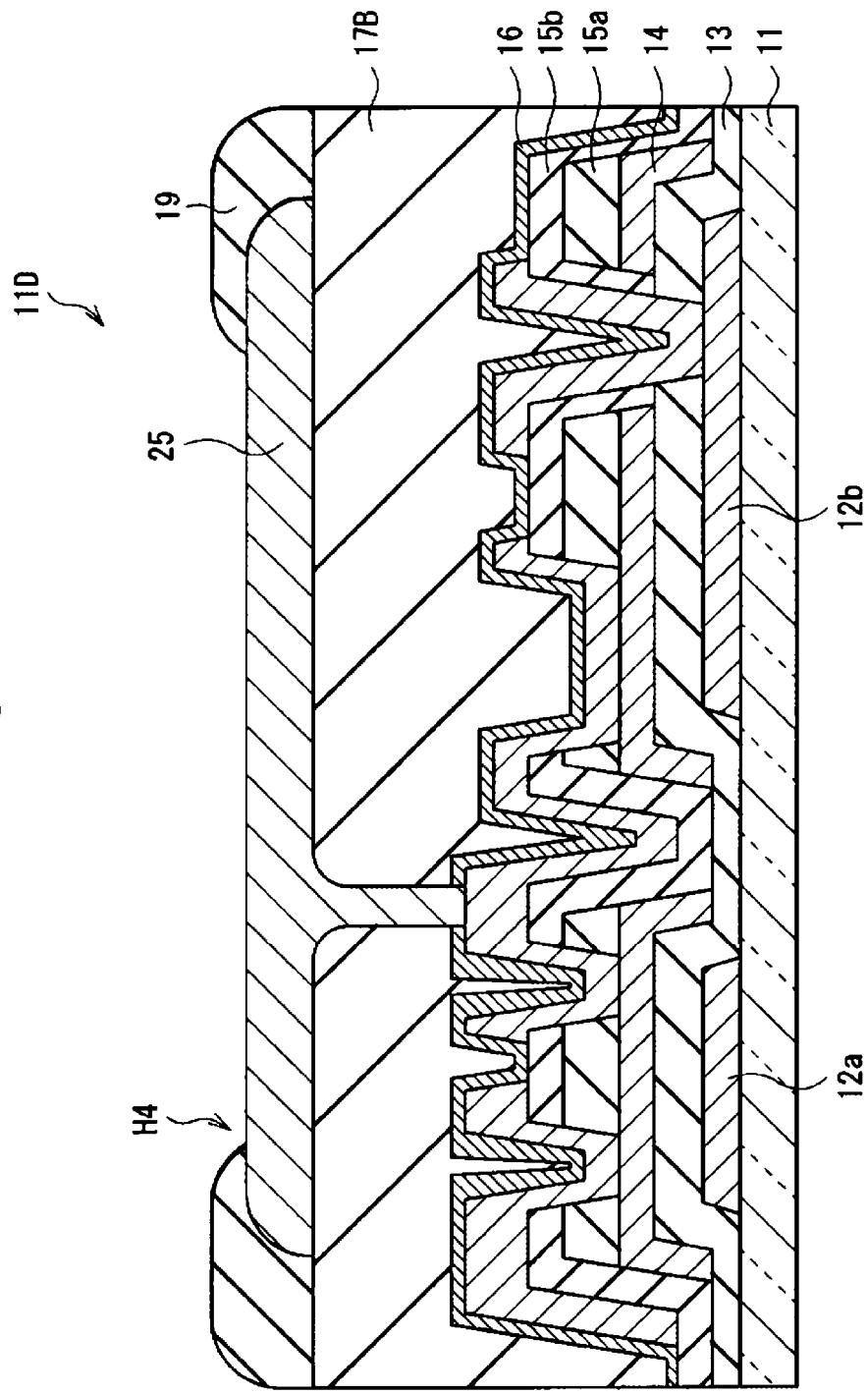
FIG. 11I is a diagram illustrating a step continued from FIG. 11H.

Next, the anode electrode 25 is formed in such a manner as to fill the contact hole H8, followed by the patterning of the same electrode 25 using the unshown photomask M6C as illustrated in FIG. 11H. Then, the pixel isolation film 19 is formed above the entire surface of the substrate, followed by the patterning of the same film 19 using the unshown photomask M7C as illustrated in FIG. 11I, thus forming the opening H4 adapted to partition the light-emitting region. The drive substrate 11D is manufactured as described above.

Then, the functional layer 20, the common electrode 21 and the protective layer 22 are formed in this order on the drive substrate 11D in the same manner as in the first embodiment, after which the sealing substrate 23 is attached to the protective layer 22, thus completing the manufacture of the display device 1D shown in FIG. 10.

[Action and Effect]

As described above, in the present embodiment, the gate electrode 12a and the electrode layer 12b are formed on the substrate 11, followed by the formation of the laminated film 24 including the semiconductor layer 14, the first protective films 15a and 15b, the source/drain electrode layer 18e, the second protective film 16, the planarizing film 17B, the anode electrode 25 and the pixel isolation film 19 on or above the gate electrode 12a with the gate insulating film 13 sandwiched therebetween by photolithography techniques in the manufacturing process of the display device 1D (drive substrate 11D). Then, the functional layer 20 including the organic EL layer and the common electrode 21 are formed in this order. In the step of forming the laminated film 14, two or more layers are patterned together in at least part of the laminated film 24. Here, for example, the first protective film 15a and the semiconductor layer 14 are patterned all together using the photomask M2C, thus forming the contact hole H1a to penetrate the first protective film 15a and the semiconductor layer 14 in the region 10D1. Further, after the formation of the contact hole H1a, the first protective film 15b and the gate insulating film 13 are patterned all together in the region 10D1 using the photomask M3C, thus forming the contact hole H1c.

That is, the present embodiment also changes for the better the configuration of the layers making up the laminated film 24 and the order thereof, thus ensuring a reduced number of times of patterning by photolithography as compared to the above comparative example. This contributes to less consumption of photomasks, photoresist and other materials and a smaller number of steps, thus allowing for manufacture of a display device by a low-cost and simple process.

[Configuration of the Display Device and Pixel Circuit Configuration]

Figure 12:
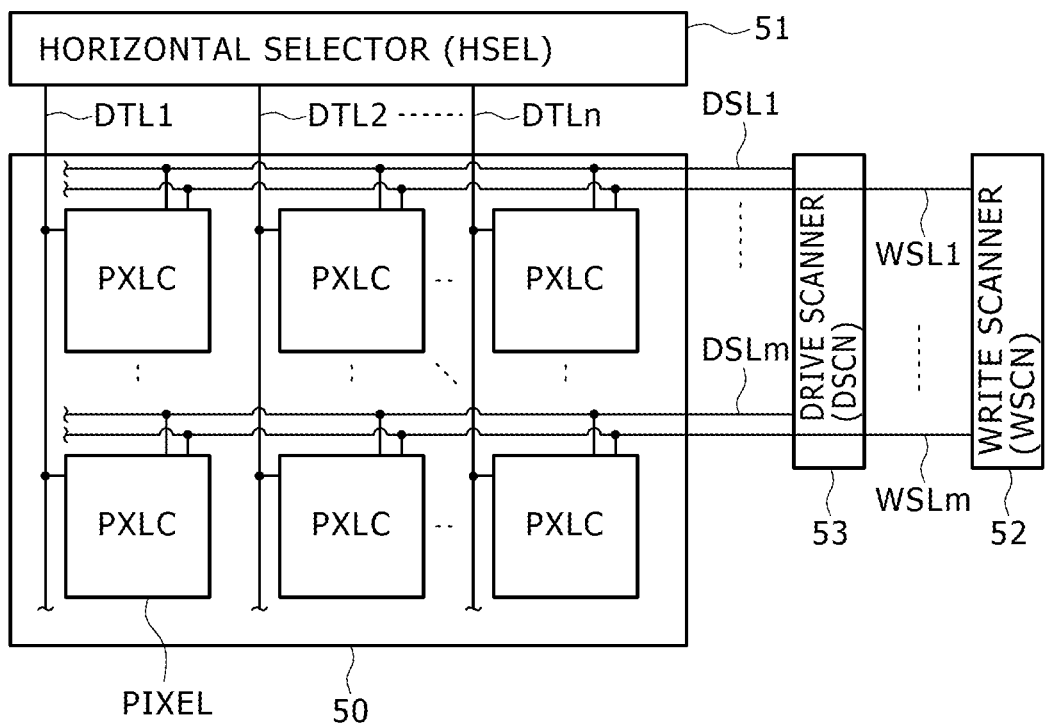
FIG. 12 is a diagram illustrating the overall configuration including peripheral circuitries of the display device according to the embodiments.

A description of the overall configuration of the display devices 1A to 1D (hereinafter simply referred to as the display devices) respectively according to the first to fourth embodiments and the pixel circuit configuration thereof will be given next. FIG. 12 illustrates the overall configuration including peripheral circuitry of the display device used as an organic EL display. As described above, a display region 50 is formed on, for example, the substrate 11. The display region 50 has a plurality of pixels PXLC arranged in a matrix form. Each of the pixels PXLC includes an organic EL element. A horizontal selector (HSEL) 51, a write scanner (WSCN) 52 and a drive scanner (DSCN) 53 are provided around the display region 50. The horizontal selector 51 serves as a signal drive circuit. The write scanner 52 serves as a scan drive circuit. The drive scanner 53 serves as a power line drive circuit.

In the display region 50, a plurality (integer n) of signal lines DTL1 to DTLn are arranged in the column direction, with a plurality (integer m) of scan lines WSL1 to WSLm and power lines DSL1 to DSLm respectively arranged in the row direction. Further, the pixel PXLC (one of red, green and blue pixels) is provided at each of the intersections between one of the signal lines DTL and one of the scan lines WSL. Each of the signal lines DTL is connected to the horizontal selector 51 so that a video signal is supplied from the horizontal selector 51 to each of the signal lines DTL. Each of the scan lines WSL is connected to the write scanner 52 so that a scan signal (selection pulse) is supplied from the write scanner 52 to each of the scan lines WSL. Each of the power lines DSL is connected to the drive scanner 53 so that a power signal (control pulse) is supplied from the drive scanner 53 to each of the power lines DSL.

Figure 13:
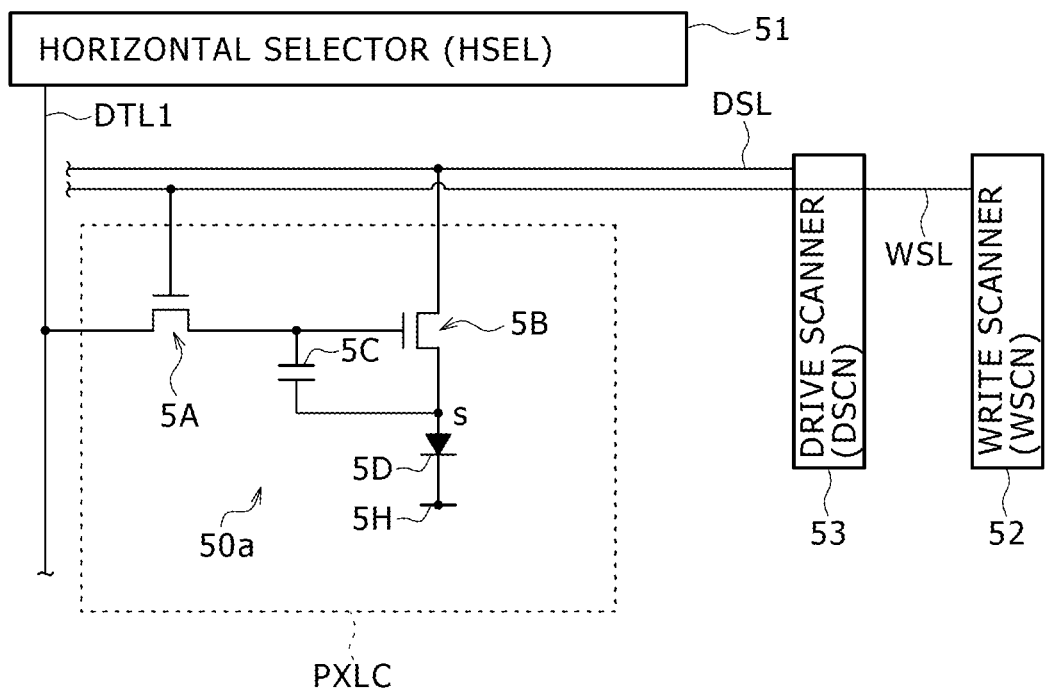
FIG. 13 is a diagram illustrating the circuit configuration of a pixel shown in FIG. 12.

FIG. 13 illustrates a specific circuit configuration example of the pixel PXLC. Each of the pixels PXLC has a pixel drive circuit 50a including an organic EL element 5D. The pixel drive circuit 50a is an active drive circuit having a sampling transistor 5A, a drive transistor 5B, a holding capacitive element 5C and the organic EL element 5D. Of these components, the transistor 5A (or transistor 5B) corresponds to the transistor section 10B in the above embodiments, and the holding capacitive element 5C to the capacitor section 10C in the above embodiments.

The sampling transistor 5A has its gate connected to the associated scan line WSL, one of its source and drain to the associated signal line DTL, and the other of its source and drain to the gate of the drive transistor 5B. The drive transistor 5B has its drain connected to the associated power line DSL and its source to the anode of the organic EL element 5D. The cathode of the organic EL element 5D is connected to a grounding interconnect 5H. It should be noted that the grounding interconnect 5H is shared by all the pixels PXLC. The holding capacitive element 5C is arranged between the source and gate of the drive transistor 5B.

The sampling transistor 5A goes into conduction in response to a scan signal (selection pulse) supplied from the scan line WSL, thus sampling the video signal potential supplied from the signal line DTL and allowing the potential to be held by the holding capacitive element 5C. The drive transistor 5B is supplied with a current from the power line DSL at a predetermined first potential (not shown), thus supplying a drive current commensurate with the signal potential held by the holding capacitive element 5C to the organic EL element 5D. When supplied with the drive current from the drive transistor 5B, the organic EL element 5D emits light at the brightness commensurate with the video signal potential.

In such a circuit configuration, the sampling transistor 5A goes into conduction in response to a scan signal (selection pulse) supplied from the scan line WSL, thus sampling the video signal potential supplied from the signal line DTL and allowing the potential to be held by the holding capacitive element 5C. Further, a current is supplied from the power line DSL at the above predetermined first potential to the drive transistor 5B, thus supplying a drive current commensurate with the signal potential held by the holding capacitive element 5C to the organic EL element 5D (each of the red, green and blue organic EL elements). When supplied with the drive current, the organic EL element 5D emits light at the brightness commensurate with the video signal potential, thus allowing for an image to be displayed on the display device based on the video signal.

APPLICATION EXAMPLES

A description of application examples of one of the above display devices (display devices 1A to 1D) to electronic equipment will be given below. Among examples of electronic equipment are a television set, a digital camera, a laptop personal computer, a personal digital assistance such as a mobile phone and a video camcorder. In other words, one of the above display devices is applicable to electronic equipment across all disciplines adapted to display a video signal fed thereto or generated therein as an image or picture.

(Module)

Figure 14:
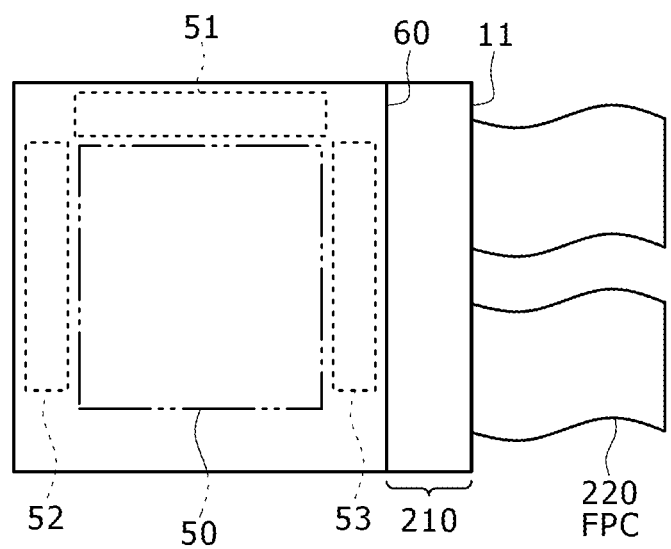
FIG. 14 is a plan view illustrating the schematic configuration of a module including the display device shown in FIG. 12.

One of the above display devices is built into a variety of electronic equipment including application examples 1 to 5, which will be described later, as a module as shown in FIG. 14, for example. This module is manufactured, for example, as follows. That is, a region 210 exposed from a sealing substrate 60 is provided on one side of the substrate 11. Then, the interconnects of the horizontal selector 51, the write scanner 52 and the drive scanner 53 are extended to the exposed region 210, thus forming external connection terminals (not shown). An FPC (flexible printed circuit) 220 adapted to exchange signals may be provided on the external connection terminals.

Application Example 1

Figure 15:
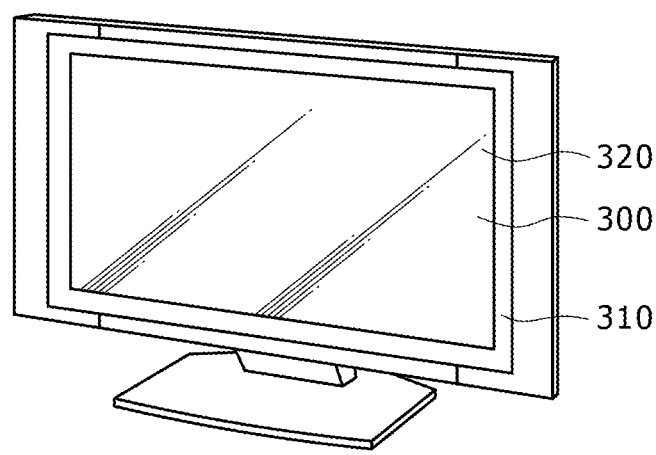
FIG. 15 is a perspective view illustrating the appearance of application example 1.

FIG. 15 illustrates the appearance of a television set. This television set has, for example, a video display screen section 300 including a front panel 310 and a filter glass 320. The video display screen section 300 corresponds to one of the above display devices.

Application Example 2

Figure 16A:
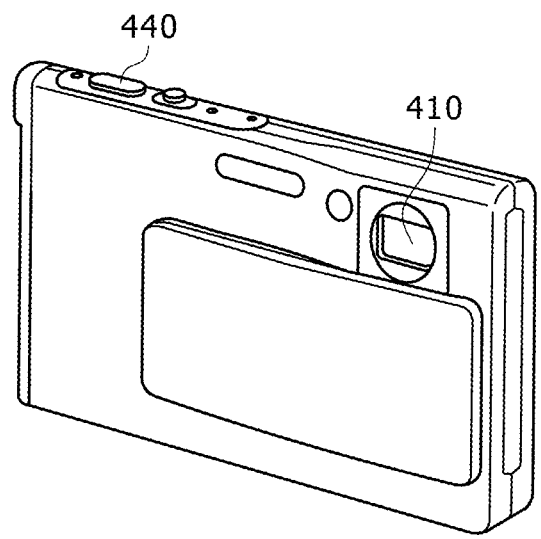
FIG. 16A is a perspective view illustrating the appearance of application example 2 as seen from the front.
Figure 16B:
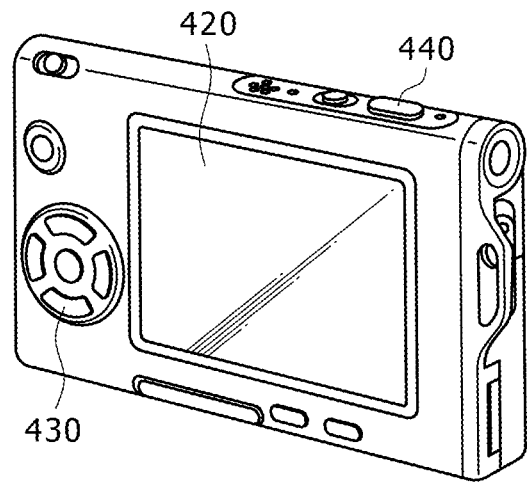
FIG. 16B is a perspective view illustrating the appearance thereof as seen from the back.

FIGS. 16A and 16B illustrate the appearance of a digital camera. This digital camera has, for example, a flash-emitting section 410, a display section 420, a menu switch 430 and a shutter button 440. The display section 420 corresponds to one of the above display devices.

Application Example 3

Figure 17:
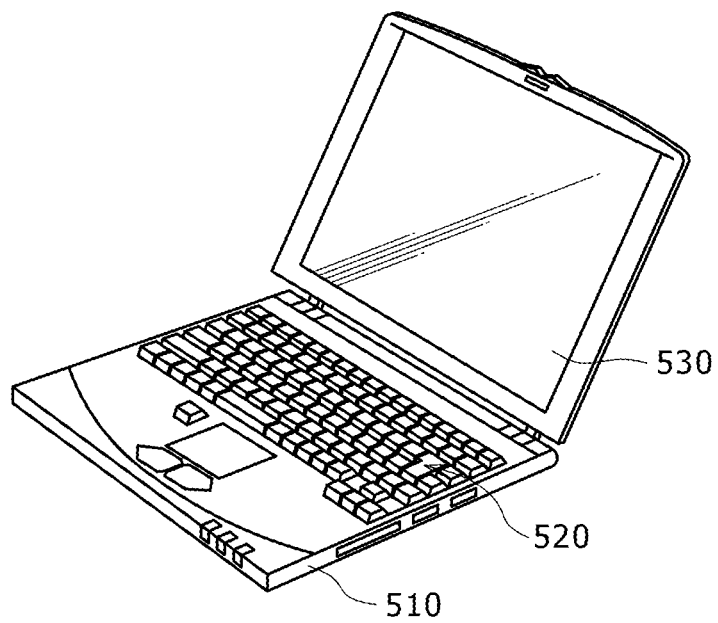
FIG. 17 is a perspective view illustrating the appearance of application example 3.

FIG. 17 illustrates the appearance of a laptop personal computer. This laptop personal computer has, for example, a main body 510, a keyboard 520 adapted to be manipulated for entry of text or other information and a display section 530 adapted to display an image. The display section 530 corresponds to one of the above display devices.

Application Example 4

Figure 18:
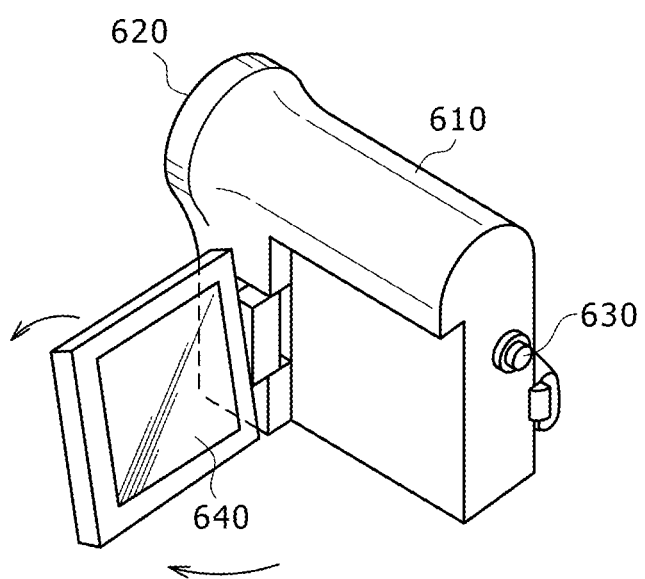
FIG. 18 is a perspective view illustrating the appearance of application example 4.

FIG. 18 illustrates the appearance of a video camcorder. This video camcorder has, for example, a main body section 610, a lens 620 provided on the front-facing side surface to capture the image of the subject, an imaging start/stop switch 630 and a display section 640. The display section 640 corresponds to one of the above display devices.

Application Example 5

FIGS. 19A to 19G illustrate the appearance of a mobile phone. This mobile phone is made up, for example, of an upper enclosure 710 and a lower enclosure 720 that are connected together with a connecting section (hinge section) 730 and has a display 740, a subdisplay 750, a picture light 760 and a camera 770. Each of the display 740 and subdisplay 750 corresponds to one of the above display devices.

Although the present disclosure has been described above with reference to the preferred embodiments, the present disclosure is not limited thereto and may be modified in various ways. For example, although examples have been described in the above embodiments in which the bottom gate TFT has the first protective film 15, the same film 15 does not necessarily have to be provided.

Further, cases have been taken in the above embodiments as examples in which four to seven photomasks are used to form the drive substrate by patterning (three to six in the step of forming the laminated film 24). However, eight photomasks may be used to form the drive substrate (seven in the step of forming the laminated film 24). In the manufacturing process according to the comparative example shown in FIGS. 3A to 3H, for example, etching the second protective film 107 using the planarizing film 108 as a mask contributes to the reduction of the number of photomasks used by one as compared to the manufacturing process according to the comparative example.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
a gate electrode provided on a substrate;
a laminated film provided above the gate electrode with a gate insulating film sandwiched therebetween, the laminated film including, in this order, a semiconductor layer, first and second protective films, a planarizing film, a first electrode layer and a pixel isolation film;
a functional layer provided on the pixel isolation film of the laminated film and including an organic electric field light-emitting layer in a light-emitting region; and
a common electrode provided on the functional layer,
wherein the gate electrode comprises a first segment of a second electrode layer in a transistor region, wherein the second electrode layer includes a second segment under the gate insulating film in a capacitor region and in an interconnect region, wherein the first electrode layer includes a first transistor segment in contact with a first area of the semiconductor layer in the transistor region, a second transistor segment in contact with a second area of the semiconductor layer in the transistor region and in contact with the functional layer in the light-emitting region, a capacitor segment in direct physical contact with the semiconductor layer in the capacitor region, and an interconnect segment in contact with the second segment of the second electrode layer in the interconnect region, and wherein the first transistor segment, the second transistor segment, the capacitor segment and the interconnect segment comprise individual segments, patterned to be separate from one another, of the first electrode layer.

2. The display device according to claim 1, comprising:
wherein the second transistor segment serves as a drain electrode and a pixel electrode.

3. The display device according to claim 2, wherein:
the first protective film is made of at least one of silicon oxide, silicon nitride and silicon oxynitride between the semiconductor layer and the planarizing film.

4. The display device according to claim 3, wherein:
the second protective film is made of aluminum oxide between the first protective film and the planarizing film.

5. The display device according to claim 4, wherein
the second transistor segment of the first electrode layer is in contact with the semiconductor layer in a first opening penetrating at least the planarizing film, the first protective film and the second protective film,
the capacitor segment of the first electrode layer is in contact with the semiconductor layer in a second opening penetrating the planarizing film, the second protective film and the first protective film in the capacitor region, and
the interconnect segment of the first electrode layer is in contact with the second segment of the second electrode layer in a third opening penetrating the planarizing film, the second protective film and the gate insulating film in the interconnect region.

6. The display device according to claim 1, wherein a metal film made of an AlNd alloy is a part of the first and second transistor segments and a topmost surface of the first and second transistor segments of the first electrode layer.

7. Electronic equipment comprising:
a display device including
a gate electrode provided on a substrate,
a laminated film provided above the gate electrode with a gate insulating film sandwiched therebetween, the laminated film including, in this order,
a semiconductor layer,
first and second protective films,
a planarizing film,
a first electrode layer, and
a pixel isolation film,
a functional layer provided on the pixel isolation film of the laminated film and including an organic electric field light-emitting layer in a light-emitting region, and
a common electrode provided on the functional layer,
wherein the gate electrode comprises a first segment of a second electrode layer in a transistor region, wherein the second electrode layer includes a second segment under the gate insulating film in a capacitor region and in an interconnect region, wherein the first electrode layer includes a first transistor segment in contact with a first area of the semiconductor layer in the transistor region, a second transistor segment in contact with a second area of the semiconductor layer in the transistor region and in direct physical contact with the functional layer in the light-emitting region, a capacitor segment in contact with the semiconductor layer in the capacitor region, and an interconnect segment in contact with the second segment of the second electrode layer in the interconnect region, and wherein the first transistor segment, the second transistor segment, the capacitor segment and the interconnect segment comprise individual segments, patterned to be separate from one another, of the first electrode layer.

8. The electronic equipment according to claim 7, wherein the display device comprises:
wherein the second transistor segment serves as a drain electrode and a pixel electrode.

9. The electronic equipment according to claim 8, wherein the first protective film is made of at least one of silicon oxide, silicon nitride and silicon oxynitride between the semiconductor layer and the planarizing film.

10. The electronic equipment according to claim 9, wherein the second protective film is made of aluminum oxide between the first protective film and the planarizing film.

11. The electronic equipment according to claim 10, wherein
the second transistor segment of the first electrode layer is in contact with the semiconductor layer in a first opening penetrating at least the planarizing film, the first protective film and the second protective film,
the capacitor segment of the first electrode layer is in contact with the semiconductor layer in a second opening penetrating the planarizing film, the second protective film and the first protective film in the capacitor region, and
the interconnect segment of the first electrode layer is in contact with the second segment of the second electrode layer in a third opening penetrating the planarizing film, the second protective film and the gate insulating film in the interconnect region.

12. The electronic equipment according to claim 7, wherein a metal film made of an AlNd alloy is a part of the first and second transistor segments and a topmost surface of the first and second transistor segments of the first electrode layer.

* * * * *

UNITED STATES PATENT AND TRADEMARK OFFICE
CERTIFICATE OF CORRECTION

PATENT NO. : 9,324,741 B2
APPLICATION NO. : 13/417360
DATED : April 26, 2016
INVENTOR(S) : Takahide Ishii Page 1 of 1

It is certified that error appears in the above-identified patent and that said Letters Patent is hereby corrected as shown below:

In the Specification

Col. 1, line 67, should read:
and includes a semiconductor layer, at least either a source/

Col. 8, line 7, should read:
nated film 24) is formed using photolithography tech Col. 18, lines 53 and 54, should read:
this order. In the step of forming the laminated film 24, two or
more layers are patterned all together in at least part of the laminated film In the Claims Col. 21, line 67, should read:
direct physical contact with the functional layer in the light-emitting Col. 22, line 1, should read:
region, a capacitor segment in contact Signed and Sealed this
Fifth Day of July, 2016

Michelle K. Lee
*Director of the United States Patent and Trademark Office*